United States Patent
Wang

(10) Patent No.: US 8,067,817 B2
(45) Date of Patent: Nov. 29, 2011

(54) SEMICONDUCTOR DEVICE AND METHOD OF MANUFACTURING THE SAME

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/557,159

(22) Filed: Sep. 10, 2009

(65) Prior Publication Data

US 2009/0321877 A1 Dec. 31, 2009

Related U.S. Application Data

(63) Continuation of application No. PCT/JP2007/055053, filed on Mar. 14, 2007.

(51) Int. Cl.
*H01L 29/00* (2006.01)
*H01L 29/76* (2006.01)
*H01L 31/113* (2006.01)
*H01L 21/02* (2006.01)
*H01L 29/92* (2006.01)

(52) U.S. Cl. ............... 257/532; 257/295; 257/E21.008; 257/E29.343

(58) Field of Classification Search .................. 257/532, 257/295, E21.008, E29.343
See application file for complete search history.

(56) References Cited

U.S. PATENT DOCUMENTS

| | | | |
|---|---|---|---|
| 5,976,928 A * | 11/1999 | Kirlin et al. | 438/240 |
| 6,624,458 B2 | 9/2003 | Takamatsu et al. | |
| 7,220,600 B2 * | 5/2007 | Summerfelt et al. | 438/3 |
| 7,456,454 B2 | 11/2008 | Sashida | |
| 2002/0185668 A1 | 12/2002 | Takamatsu et al. | |
| 2003/0089954 A1 | 5/2003 | Sashida | |
| 2006/0134808 A1 | 6/2006 | Summerfelt et al. | |
| 2007/0194361 A1 * | 8/2007 | Kokubun | 257/295 |
| 2009/0068764 A1 | 3/2009 | Sashida | |

FOREIGN PATENT DOCUMENTS

| | | |
|---|---|---|
| JP | 2002-324894 A | 11/2002 |
| JP | 2003-017581 A | 1/2003 |
| JP | 2003-100912 A | 4/2003 |
| JP | 2003-152165 A | 5/2003 |
| JP | 2003-258201 A | 9/2003 |
| JP | 2006-032451 A | 2/2006 |

OTHER PUBLICATIONS

International Search Report of PCT/JP2007/055053, date of mailing Aug. 28, 2007.
Chinese Office Action dated Apr. 29, 2011 from the Chinese State Intellectual Property Office in a counterpart Chinese Patent Application No. 200780052165.1.

* cited by examiner

*Primary Examiner* — Luan C Thai
(74) *Attorney, Agent, or Firm* — Westerman, Hattori, Daniels & Adrian, LLP

(57) ABSTRACT

A semiconductor device includes a ferroelectric capacitor formed over a semiconductor substrate, wherein the ferroelectric capacitor including a lower electrode, a ferroelectric film formed on the lower electrode, and an upper electrode formed on the ferroelectric film, and the upper electrode including a first conductive film formed of a first conductive noble metal oxide, and a second conductive film formed of a metal nitride compound formed on the first conductive film.

12 Claims, 24 Drawing Sheets

SEMICONDUCTOR DEVICE AND METHOD OF MANUFACTURING THE SAME

This application is a continuation application of international application PCT/JP2007/055053, filed Mar. 14, 2007.

FIELD

The present invention relates to a semiconductor device and a method of manufacturing the same.

BACKGROUND

In recent years, there are growing trends of high-speed processing and save of a large data with the rise of the digital technology. Consequently, a higher integration density and a higher performance are demanded in the semiconductor device equipped in the electronic equipment.

As to a semiconductor memory device, for example, in order to realize a higher integration density of DRAM (Dynamic Random Access Memory), the technology to employ a ferroelectric material or a high-dielectric material as a capacitor insulating film of a capacitor element constituting DRAM, instead of the conventional silicon oxide or silicon nitride, is widely researched and developed.

As the nonvolatile memory that does not lose the stored information even after a power supply is cut off, the flash memory and the ferroelectric memory (FeRAM: Ferroelectric Random Access Memory) are known until now.

The flash memory has a floating gate that is embedded in a gate insulating film of an insulated-gate field effect transistor (IGFET), and stores the information by accumulating the charges representing the stored information in the floating gate. A tunnel current passing through the insulating film must fed to write/erase the information, and a relatively high voltage is needed.

Also, in order to realize the nonvolatile RAM that can execute a writing operation and a reading operation quickly at a lower voltage, the technology to employ a ferroelectric film having the spontaneous polarization characteristic as a capacitor insulating film is eagerly researched and developed. The semiconductor memory device having such ferroelectric capacitor insulating film is called a ferroelectric memory (FeRAM).

The FeRAM stores the information by utilizing the hysteresis characteristic of the ferroelectric substance. The ferroelectric capacitor structure in which the ferroelectric film is put between a pair of electrodes is provided to the ferroelectric memory produces a polarization in response to an applied voltage between the electrodes, and keeps a spontaneous polarization even after the applied voltage is removed. Also, the polarity of the spontaneous polarization is inverted when the polarity of the applied voltage is inverted. Therefore, the information can be read by sensing this spontaneous polarization.

The ferroelectric memory operates at a low voltage rather than a flash memory, and can execute a speedup writing while achieving a power saving. A study of the logic combined chip (SOC: System On Chip), in which the FeRAM is combined with the conventional logic technology, as the applications of the IC card, etc. is now conducted.

The ferroelectric film constituting the capacitor of FeRAM is formed of lead zirconate titanate (PZT), PZT in which La is doped (PLZT), PLZT-based material in which Ca, Sr, or Si is micro-doped, a Bi-layer structure compound such as $SrBi_2Ta_2O_9$(SBT,YI), $SrBi_2(Ta, Nb)_2O_9$(SBTN,YZ), or the like. Such ferroelectric film is formed by the sol-gel method, the sputter method, the MOCVD (Metal Organic Chemical Vapor Deposition) method, or the like.

Normally, an amorphous or microcrystalline ferroelectric film is formed on the lower electrode by the above film forming method, and then the crystal structure is changed into the perovskite structure or the bismuth layer structure by the subsequent heat treatment. Also, a film quality is improved by oxidation after the ferroelectric film is formed.

Therefore, as the electrode material of the capacitor, the material that is hard to oxidize or the material that can maintain conductivity even after oxidized must be employed. Commonly, either a platinum based metal such as Pt (platinum), Ir (iridium), $IrO_x$ (iridium oxide), or the like or its oxide is widely employed. Also, it is common that, as the wiring material, Al (aluminum) is employed like the normal semiconductor device.

In the FeRAM, such a problem existed that the ferroelectric film is ready to deteriorate by the hydrogen that is produced in various steps after the ferroelectric capacitor structure is formed, and the like. Therefore, in order to protect the ferroelectric film from the hydrogen, etc., the technology to form the upper electrode by using the conductive oxide such as iridium oxide ($IrO_x$), or the like, for example has been presented.

However, it may be considered that, when the conductive oxide is employed as the material of the upper electrode, the oxygen contributes to the block of the hydrogen, etc., nevertheless such a problem arises that the underlying film of the connection plug, e.g., Ti, TiN, or the like, positioned right on the upper electrode is oxidized by the emitted oxygen to bring about an increase of a contact resistance. Therefore, the technology to prevent oxidation of the underlying film by forming the oxidation-resistant metal film such as iridium (Ir), or the like on the conductive oxide has been presented.

Further, following structures are disclosed as the capacitor electrode.

In Japanese Laid-open Patent Application Publication No. JP 2002-3244894-A, it is set forth that, when the upper electrode formed on ferroelectric film is constructed by the first conductive oxide film and the second conductive oxide film such that the second conductive oxide film is formed to have a composition that is closer to a stoichiometric composition than the first conductive oxide film, the electric characteristics of the ferroelectric capacitor can be finely patterned without deterioration during the step of constructing the multilayer wiring.

In Japanese Laid-open Patent Application Publication No. JP 2003-17581-A, the semiconductor device equipped with the capacitor having such a structure that at least one of the upper electrode and the lower electrode is formed of a titanium aluminum nitride layer represented by $Ti_xAl_{1-x}N$ (x=0.05 to 0.5) and the high-dielectric metal oxide film such as tantalum oxide, or the like is put between the upper electrode and the lower electrode constructed as above is set forth.

In Japanese Laid-open Patent Application Publication No. JP 2003-100912-A, it is set forth that, when the capacitor upper electrode is formed of Pt and then an oxidation-resistant TiAlN barrier film is provided onto the upper electrode, the deterioration of the characteristics of the capacitor insulating film caused due to the exposure of the upper electrode is avoided.

In Japanese Laid-open Patent Application Publication No. JP 2006-32451-A, it is proposed that, in order to prevent the deterioration of the contact plug cause by a catalytic action of hydrogen, the capacitor lower electrode on the contact plug is formed on a Pt/$IrO_x$/Ir/TiAlN stacked layer structure.

In Japanese Laid-open Patent Application Publication No. JP 2003-258201-A, a method of etching collectively the constitutive films of the capacitor by using the hard mask is disclosed. In this case, the material of the oxygen barrier film is formed of TiN, TiAlN, Ir, or their oxide, or Ru, $RuO_x$.

In Japanese Laid-open Patent Application Publication No. JP2003-152165-A, it is proposed that, when such a method is employed that the contact holes that expose the upper electrode of the ferroelectric capacitor are formed in the insulating film, then an adhesive film made of TiN is formed in the contact holes after the annealing in an oxidizing atmosphere, and then the W film is stacked/filled in the contact holes by the CVD method while using such TiN adhesive film as a hydrogen barrier, deterioration of the characteristic of the ferroelectric capacitor is prevented.

SUMMARY

According to an aspect of the invention, there is provided a semiconductor device which includes a ferroelectric capacitor formed over a semiconductor substrate, wherein the ferroelectric capacitor having a lower electrode, a ferroelectric film formed on the lower electrode, and an upper electrode formed on the ferroelectric film, and the upper electrode having a first conductive film formed of a first conductive noble metal oxide, and a second conductive film formed of a metal nitride compound formed on the first conductive film.

According to an another aspect of the invention, there is provided a method of manufacturing a semiconductor device, comprising, forming a lower electrode over a semiconductor substrate, forming a ferroelectric film on the lower electrode, and forming an upper electrode on the ferroelectric film, wherein the upper electrode is formed by forming a first conductive film of a first noble metal oxide film over the ferroelectric film, and forming a second conductive film of a metal compound including nitride over the first conductive film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
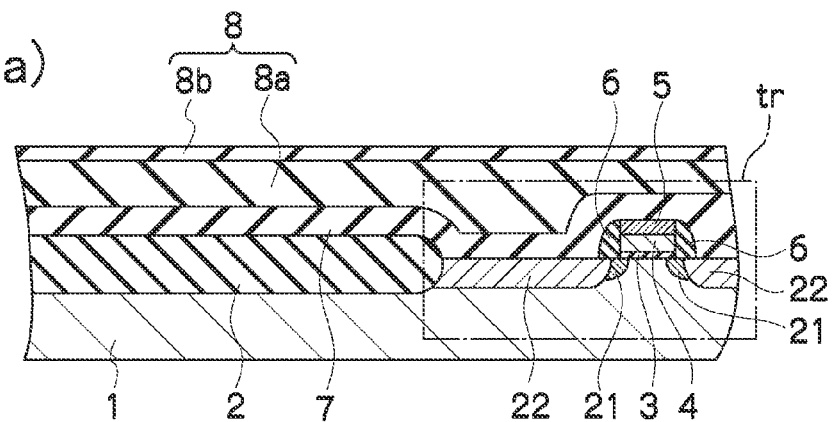
FIGS. 1(*a*), 1(*b*), 1(*c*), 2(*a*), 2(*b*), 2(*c*), 3(*a*), 3(*b*), 3(*c*), 4(*a*), 4(*b*), 5(*a*), 5(*b*), 6(*a*), 6(*b*,), 7(*a*), and 7(*b*) are sectional views illustrating steps of forming a semiconductor device according to a first embodiment of the present invention.

In the structure the capacitor upper electrode is formed only of the TiAlN film, when a film thickness of the TiAlN film is increased to decrease a resistance of the upper electrode, oxygen is difficult to pass through the upper electrode. As a result, the ferroelectric film under the upper electrode may not be sufficiently oxidized in the later step.

Also, according to the structure including the capacitor upper electrode formed of Pt and the anti-oxidant TiAlN barrier film formed on the upper electrode, a resistance of the upper electrode may be decrease by thickening the Pt film of the lower portion of the upper electrode, and also an oxygen transmittance may be enhanced by thinning the overlying TiAlN film on the Pt film. However, Pt acts as a catalyst of a reducing gas such as hydrogen, or the like. Therefore, when hydrogen, and the like that passed through the TiAlN barrier film enter into the Pt film, it is impossible to prevent reduction deterioration of the ferroelectric oxide film under the Pt film.

Therefore, the electric characteristics of the capacitor may not be sufficiently brought out by using their structures.

In contrast, according to the structure that the upper electrode formed on ferroelectric film is formed by the first and second conductive oxide films, the electric characteristics of the capacitor may be improved. But in some cases degradation of the capacitor characteristics may be caused depending on the forming conditions of the upper electrode.

More specifically, in the capacitor upper electrode on the ferroelectric film, the second conductive oxide film is formed of a composition that is closer to a stoichiometric composition than the first conductive oxide film. In this case, when the second conductive oxide film is made thick, an abnormal growth is caused in the second conductive oxide film itself and then a film quality of the ferroelectric film below the second conductive oxide film may be deteriorated.

It is an object of the present invention to provide a semiconductor device equipped with a ferroelectric capacitor including an upper electrode that is suited for an improvement of the capacitor characteristics.

According to the invention, in an upper electrode of a ferroelectric capacitor, a first conductive noble metal oxide film whose degree of oxidation is made low is formed as a first conductive film on a ferroelectric film. Then, a boundary between such first conductive film and the ferroelectric film is flat. Therefore, the capacitor characteristic is improved.

Also, a second conductive film formed of the metal nitride compound formed on the first conductive film prevents hydrogen or moisture, which passed through an interlayer insulating film or a contact hole formed over the upper electrode, from entering into the first conductive film. Then, a reduction of the first conductive film may be prevented.

Since the upper electrode constructed as above is employed, a process-deterioration-resistant of the capacitor is improved greatly. Also, a quantity of inverted charge of the ferroelectric capacitor is improved, and a coercive electric field is reduced. Further, a fatigue resistance and an imprint resistance are improved.

Non-limiting preferred embodiments of the present invention will be described with reference to the accompanying drawings. Throughout the drawings, similar symbols and numerals indicate similar items and functions.

First Embodiment

FIGS. 1(*a*), 1(*b*), 1(*c*), 2(*a*), 2(*b*), 2(*c*), 3(*a*), 3(*b*), 3(*c*), 4(*a*), 4(*b*), 5(*a*), 5(*b*), 6(*a*), 6(*b*,), 7(*a*), and 7(*b*) are sectional views illustrating steps of forming a semiconductor device according to a first embodiment of the present invention. Here, a semiconductor device in the present embodiment is a ferroelectric memory and, for convenience of explanation, its configuration will be explained along with its manufacturing method hereinafter.

First, steps required until a structure illustrated in FIG. 1(a) is formed will be explained hereunder.

An element isolation insulating film 2 for partitioning an element active region respectively is formed on a surface of a semiconductor substrate 1 made of silicon, or the like by the LOCOS (Local Oxidation of Silicon) method, for example. In this case, as the element isolation insulating film 2, a shallow trench isolation (STI) structure constructed by forming trenches on the semiconductor substrate 1 and filling a silicon oxide in the trenches may be employed.

Then, a gate electrode 4 is formed in the element active region partitioned by the element isolation insulating film 2 via a gate insulating film 3. As the gate insulating film 3, for example, a SiO2 film whose thickness is about 100 nm is formed by the thermal oxidation. Also, the gate electrode 4 is formed of a patterned polysilicon film, for example, and a silicide layer 5 is formed thereon. In this case, a dopant is doped into the polysilicon film.

The dopant is doped plural times into the semiconductor substrate 1 on both sides of the gate electrode 4, and thus a source/drain region 22 having an extension region 21 is formed. For example, the extension region 21 is formed by introducing the dopant into the semiconductor substrate 1 while using the gate electrode 4 as a mask, then an insulating sidewall 6 is formed on side surfaces of the gate electrode 4, and then the dopant is doped into the semiconductor substrate 1 while using the sidewalls 6 and the gate electrode 4 as a mask, whereby the source/drain region 22 is formed.

A transistor (MOSFET) tr is constructed by the gate insulating film 3, the gate electrode 4, the silicide layer 5, the sidewalls 6, the extension region 21, the source/drain regions 22, and the like.

Then, an oxide-nitride silicon film (SiON film) 7 is formed on a whole surface of the semiconductor substrate 1 to cover the MOSFET tr. Then, a silicon oxide film 8a is formed on the whole surface of the semiconductor substrate 1. The SiON film 7 is formed to prevent a degradation of the gate insulating film 3, etc. caused by the hydrogen that is used in forming the silicon oxide film 8a.

The silicon oxide film 8a whose thickness is about 700 nm is formed by the CVD (Chemical Vapor Deposition) method using Tetraethoxysilane (TEOS) as reaction gas, for example. Then, an upper surface of the silicon oxide film 8a is planarized by the CMP (Chemical Mechanical Polishing) method.

Then, the silicon oxide film 8a is degassed by applying the annealing process in a nitrogen ($N_2$) atmosphere at 650° C. for 30 minute. Then, an alumina ($Al_2O_3$) film having a thickness of about 20 nm is formed as an adhesion film 8b on the silicon oxide film 8a by the sputter method, for example.

As the adhesion film 8b, a Ti film, a $TiO_x$ film, or the like whose thickness is about 20 nm may be employed, in addition to the alumina film. Alternately, as the adhesion film 8b, a stacked structure consisting of a Ti film whose thickness is 20 nm and a Pt film whose thickness is 180 nm may be employed. For example, the Ti film may be formed at 150° C., and the Pt film may be formed at 100° C. or 350° C. The adhesion film 8b and the silicon oxide film 8a constitute a first interlayer insulating film 8.

According to the above steps, the structure illustrated in FIG. 1(a) is formed.

Figure 1B:
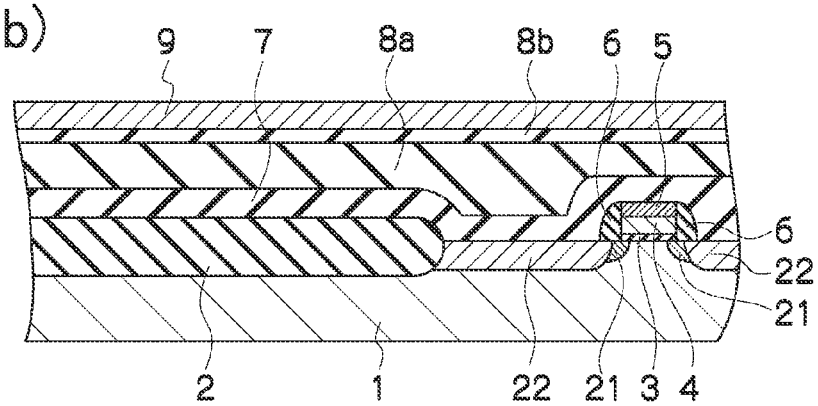

Then, as illustrated in FIG. 1(b), a lower electrode film 9 is formed on the adhesion film 8b. As the lower electrode film 9, a Pt film of about 150 nm thick is formed by the sputter method, for example.

Figure 1C:
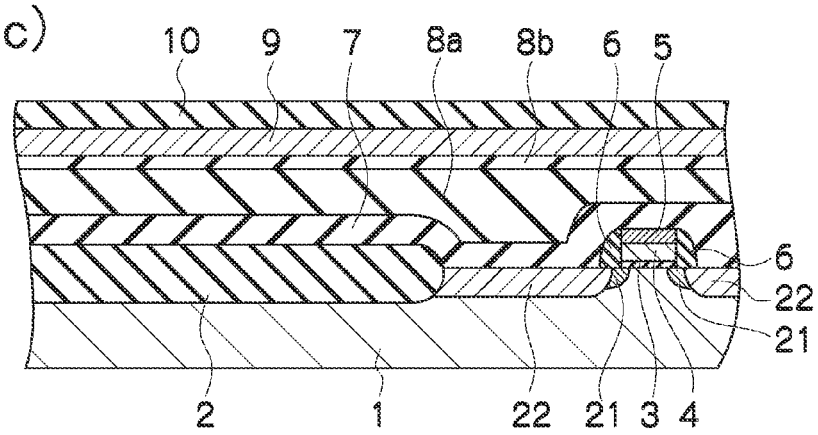

Then, as illustrated in FIG. 1(c), a ferroelectric film 10 is formed on the lower electrode film 9 in an amorphous state. As the ferroelectric film 10, a PLZT film is formed by the RF sputter method, for example, to have a thickness of about 100 nm to 200 nm. As a target of the sputter, PLZT ((Pb,La)(Zr,Ti)$O_3$), for example, is employed.

Then, RTA (Rapid Thermal Annealing) is applied to the ferroelectric film 10 and the lower electrode film 9 at 650° C. in an atmosphere containing Ar and $O_2$. Then, RTA is applied to the ferroelectric film 10 and the lower electrode film 9 at a temperature 750° C. for the second time in an oxygen atmosphere. As a result, the ferroelectric film 10 is crystallized, the Pt film constituting the lower electrode film 9 is densifyied, and mutual diffusion between Pt and O in vicinity of the boundary between the lower electrode film 9 and the ferroelectric film 10 is suppressed.

Figure 2A:
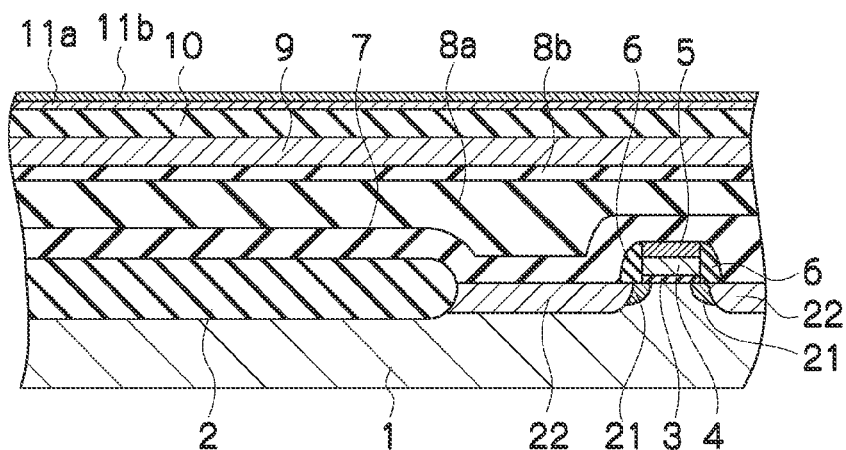
Figure 2B:
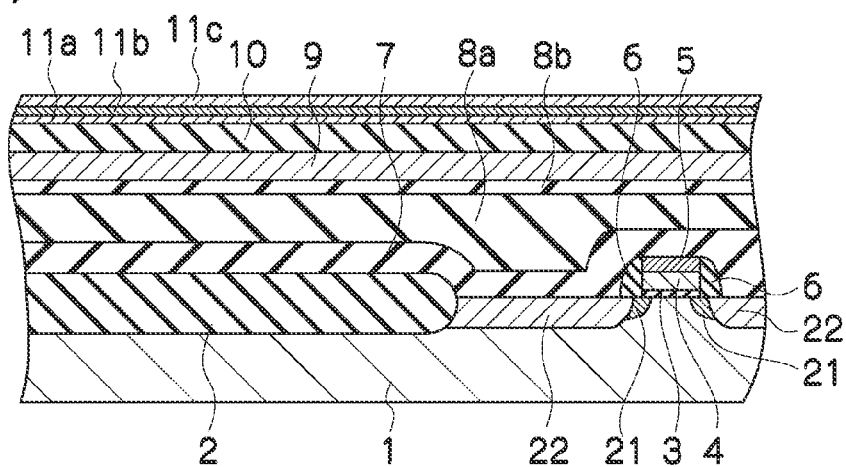
Figure 2C:
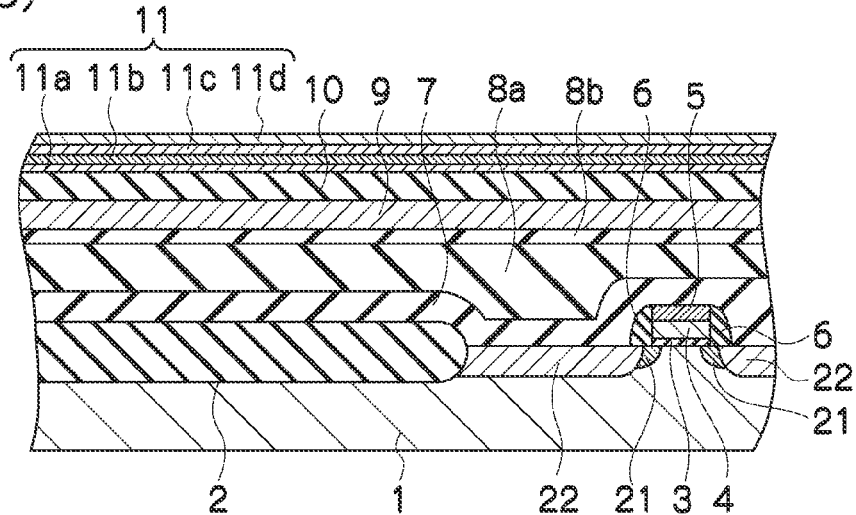

Then, as illustrated in FIGS. 2(a) to 2(c), an upper electrode film 11 is formed on the ferroelectric film 10.

Upon forming the upper electrode film 11, as illustrated in FIG. 2(a), first a first conductive oxide film 11a and a second conductive oxide film 11b are formed in order on the ferroelectric film 10.

As the first conductive oxide film 11a, an $IrO_x$ film that is crystallized at a time point of film formation is formed by the sputter method to have a thickness of 10 to 50 nm. As the growth condition of the $IrO_x$ film, for example, a film forming temperature is set to 300° C., Ar and $O_2$ are used as gas introduced in a film forming atmosphere, and a sputter power is set to 0.5 to 2.0 kW, e.g., about 1.0 kW. In this case, for example, a flow rate of Ar is set to 140 sccm, and a flow rate of $O_2$ is set to 60 sccm.

Then, the second conductive oxide film 11b made of $IrO_y$ is formed on the first conductive oxide film 11a made of $IrO_x$ by the sputter method to have a thickness of 30 nm to 200 nm. In this case, it is desirable that a particle size of $IrO_y$ should be microcrystallized into 5 to 60 nm at a time point of film formation, while setting a film forming temperature of $IrO_y$ in a range of 30° C. or more but 100° C. or less. Accordingly, an abnormal growth caused in the later annealing is suppressed.

It is assumed that Ar and $O_2$ are employed as gas introduced into the film forming atmosphere of $IrO_y$ and also a rate ($f_1/f_2$) of a flow rate $f_1$ of $O_2$ to a flow rate $f_2$ of Ar is set higher a rate applied in growing the first conductive oxide film 11a made of $IrO_x$. Then, in forming the $IrO_y$ film, for example, a flow rate of Ar is set to 100 sccm, and a flow rate of $O_2$ is set to 100 sccm. In this case, a sputter power is set to 0.5 kW to 3.0 kW, e.g., about 1.0 kW to 2.0 kW.

In order to keep the quality of the first conductive oxide film 11a constant, there is a correlation between a sputter power and an oxygen gas ratio. For example, when a sputter power is decreased, the substantially same film quality may be obtained by decreasing an oxygen gas ratio. Also, when a sputter power is increased, the substantially same film quality may be obtained by increasing an oxygen gas ratio. That film has the stone wall-like or columnar crystals.

The second conductive oxide film 11b made of $IrO_y$ formed under such conditions does not cause an abnormal oxidation, and gives the fine $IrO_y$ microcrystal films that are joined like the stone wall, for example.

In this case, the metallic element constituting the first conductive oxide film 11a and the metallic element constituting the second conductive oxide film 11b are formed of the same element mutually or the different element respectively. Such metallic element may be selected from the oxidizable noble metals such as Ir, Ru, and the like. Also, the first and second conductive oxide films 11a, 11b are formed of a conductive film that has a smaller catalytic action of educing gas than platinum, respectively.

Then, as illustrated in FIG. 2(b), a metal film 11c made of noble metal and having a thickness of 50 nm to 150 nm is formed on the second conductive oxide film 11b by the sputter method. Here, a substrate temperature is set in a range of 50° C. or more but 500° C. or less. For example, in order to relieve a stress of the metal film 11c, a substrate temperature is set in a range of 350° C. or more but 450° C. or less.

In this case, Ar is employed as gas employed in the sputter of the noble metal, and a flow rate of gas is set to 100 to 200 sccm, for example. Also, a sputter power is set to 0.5 kW to 3.0 kW, for example, about 1.0 kW to 2.0 kW.

When iridium (Ir) is applied as the noble metal, a substrate temperature is set to 400° C. and a flow rate of Ar gas is set to 199 sccm. The noble metal is one type that is selected from platinum, ruthenium, rhodium, and palladium in addition to Ir. It is preferable that the metal film 11c made of such noble metal should be formed under the conditions the columnar crystals are formed.

Then, as illustrated in FIG. 2(c), a metal nitride compound film 11d of 50 nm to 100 nm thickness is formed on the metal film 11c to prevent the hydrogen diffusion. As the metal nitride compound film 11d, for example, there are a TiAlN (titanium aluminum nitride) film, a TaAlN (tantalum aluminum nitride) film, a TiAlON (titanium aluminum nitride oxide) film, a TaAlON (titanium aluminum nitride oxide) film, a TiN film, a TaN film, and other conductive nitride metallic compounds.

For example, when the TiAlN film is formed as the metal nitride compound film 11d, such TiAlN film is formed on the substrate, which is put in the atmosphere into which Ar and nitrogen ($N_2$) are introduced at a flow rate of 40 sccm and 20 sccm respectively and whose pressure is set to 253.3 Pa, by the reactive sputter method while using a target in which Ti and Al are alloyed. Here, a substrate temperature is set to 400° C., for example, and a sputter power is set to 1.0 kW, for example.

The first conductive oxide film 11a made of $IrO_x$, the second conductive oxide film 11b made of $IrO_y$, the metal film 11c, and the metal nitride compound film 11d stacked under the above conditions are formed of a conductive film respectively, and constitute together the upper electrode film 11.

The layer structure of the upper electrode film 11 is not limited to the above four-layered structure. For example, a two-layered structure may be constructed by forming the metal nitride compound film 11d on the first conductive oxide film 11a, or a three-layered structure may be constructed by forming the metal film 11c and the metal nitride compound film 11d, in series, on the first conductive oxide film 11a. Also, a structure constructed by forming the metal nitride compound film 11d on one conductive oxide film consisting of the first and second conductive oxide films 11a, 11b.

The above the forming method of the ferroelectric film 10 and the upper electrode film 11 is given as the first example. The method containing steps in second to fifth examples explained as follows may be employed or other methods may be employed.

The second example provides the method containing steps of applying the RTA process at 560° C., for example, at a substrate temperature of 650° C. or less in an atmosphere containing Ar and $O_2$ after the ferroelectric film 10 is formed, and then forming $IrO_x$, whose thickness is 20 nm to 75 nm, as the first conductive oxide film 11a at a room temperature or a temperature higher than the room temperature.

When the film is formed at a room temperature, for example, a flow rate of Ar is set to 100 sccm and a flow rate of $O_2$ is set to 56 sccm, and a film forming power is set to 2 kW. Also, when the film is formed at a temperature that is higher than a room temperature, e.g., 300° C., for example, a flow rate of Ar is set to 140 sccm and a flow rate of $O_2$ is set to 60 sccm, and a film forming power is set to 1 kW.

After forming the first conductive oxide film 11a, the first conductive oxide film 11a is annealed at 650° C. to 750° C., e.g., 725° C., by RTA. According to this annealing, the ferroelectric film 10 is crystallized perfectly, and also the boundary between the ferroelectric film 10 and the first conductive oxide film 11a is made flat. This method is very advantageous in improving a low voltage operation of the ferroelectric capacitor and its switching characteristics.

The third example provides the method containing steps of forming the ferroelectric film 10, then heating the ferroelectric film 10 under the same condition as that in the first or second example, then forming an amorphous ferroelectric film thinner than the ferroelectric film 10, then forming the first conductive oxide film 11a on the amorphous ferroelectric film under the same conditions as that in the first or second example, and then heating the first conductive oxide film 11a under the condition as that in the second example. A feature of the capacitor formed by this method has such an advantage that a leakage current of the capacitor may be reduced, in addition to the feature explained in the method in the second example.

The fourth example provides the method containing steps of forming an amorphous ferroelectric substance film thereon when the ferroelectric film 10 is crystallized, and then forming the first conductive oxide film 11a.

The fifth example provides the method containing the step of applying the heat treatment again by RTA in a temperature range of 650 to 750° C., e.g., at a temperature of 700° C., after the second conductive oxide film 11b is formed. This method improves the adhesion between the upper electrode film 11 and the ferroelectric film 10 and also improves the crystals of the upper electrode film 11.

After the upper electrode film 11 is formed by the method mentioned above, a back surface of the semiconductor substrate 1 is cleaned.

Figure 3A:
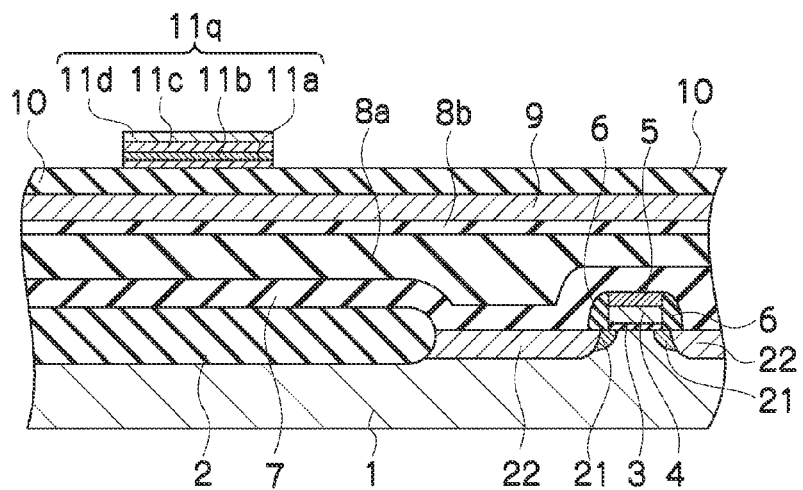

Then, as illustrated in FIG. 3(a), a capacitor upper electrode 11q is formed by patterning the upper electrode film 11 while using a mask pattern for the upper electrode. The capacitor upper electrode 11q is positioned over the element isolation insulating film 2, for example.

Then, the annealing process for recovering a film quality of the ferroelectric film 10 is applied in an $O_2$ atmosphere, at a temperature of 650° C. for 60 min. This annealing is applied to recover the physical damages caused in the ferroelectric film 10 when the capacitor upper electrode 11q is formed, and the like.

Figure 3B:
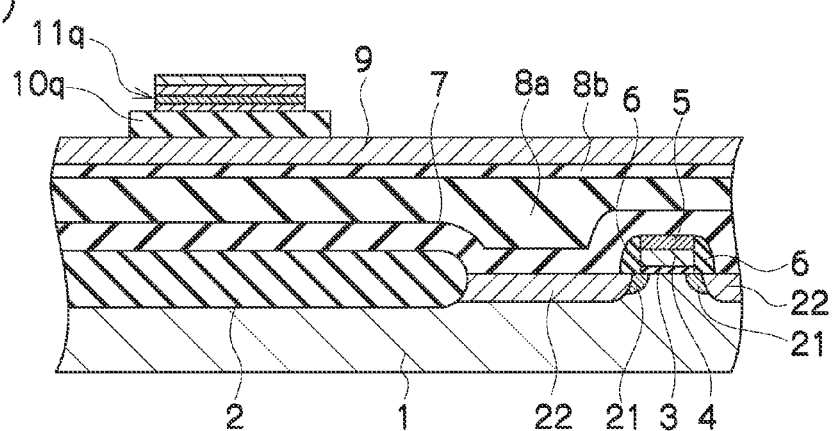

Then, as illustrated in FIG. 3(b), a capacitor ferroelectric film 10q is formed by patterning the ferroelectric film 10 using a mask (not illustrated). The capacitor ferroelectric film 10q is left in the area that overlaps with the capacitor upper electrode 11q and the area that is extended from the capacitor upper electrode 11q.

Then, an oxygen annealing is applied to the upper electrode 11q and the capacitor ferroelectric film 10a for preventing the peeling of the upper electrode film 11 formed later.

Figure 3C:
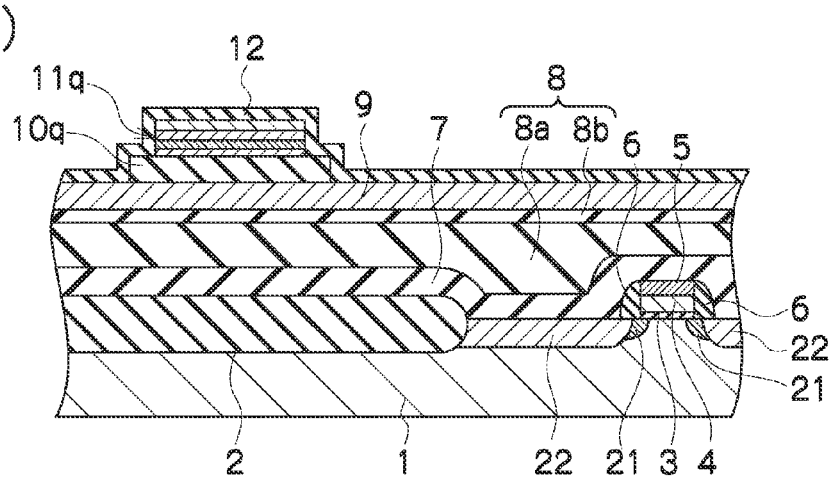

Then, as illustrated in FIG. 3(c), an $Al_2O_3$ film is formed as the first protection film 12 on a whole surface of the capacitor upper electrode 11q, the capacitor ferroelectric film 10q, and the adhesion film 8*b* by the sputter method. The first protection film 12 prevents the entering of hydrogen into the capacitor ferroelectric film 10*q* from the outside.

Then, the oxygen annealing is applied to relieve the damage of the capacitor ferroelectric film 10*q* caused by the sputtering.

Figure 4A:
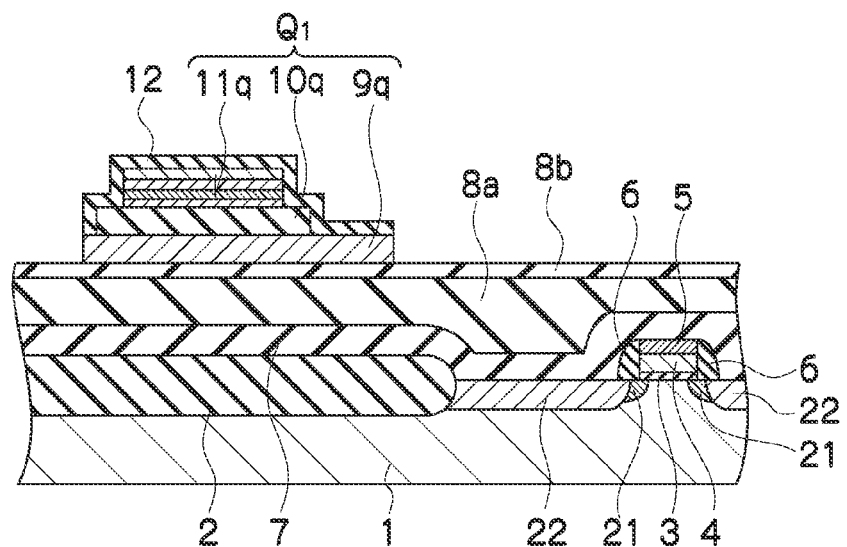
Figure 4:
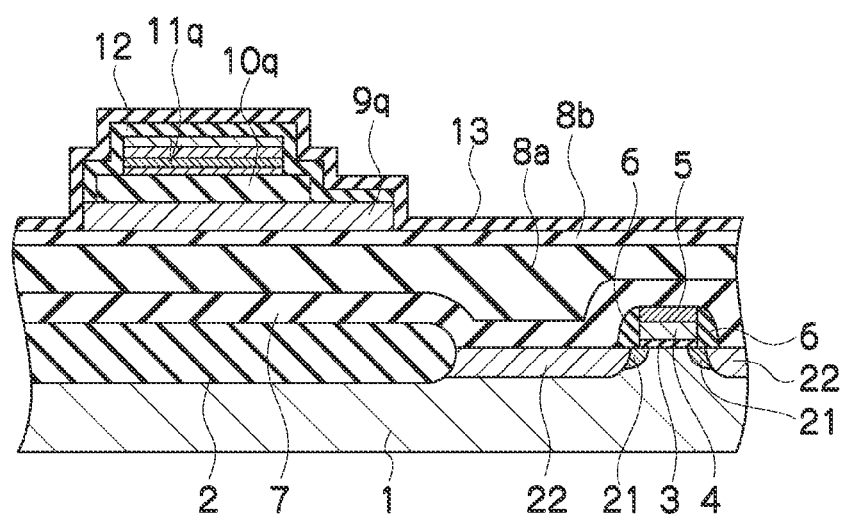

Then, as illustrated in FIG. 4(*a*), a capacitor lower electrode 9*q* formed of the lower electrode film 9 is formed by patterning successively the first protection film 12 and the lower electrode film 9 while using a mask (not illustrated). The capacitor lower electrode 9*q* has a size containing the area that overlaps with the capacitor ferroelectric film 10*q* and the capacitor upper electrode 11*q* and the area that is extended from this area.

A ferroelectric capacitor $Q_1$ is constructed by the capacitor lower electrode 9*q*, the capacitor ferroelectric film 10*q*, and the capacitor upper electrode 11*q*, which are formed by the above patterning.

Then, as illustrated in FIG. 4(*b*), an oxygen annealing for preventing the peeling of a second protection film 13 formed next is applied.

As the second protection film 13, an $Al_2O_3$ film is formed on the first protection film 12 and the adhesion film 8*b* by the sputtering method. Then, an oxygen annealing is applied to reduce a leakage current of the ferroelectric capacitor $Q_1$.

Figure 5A:
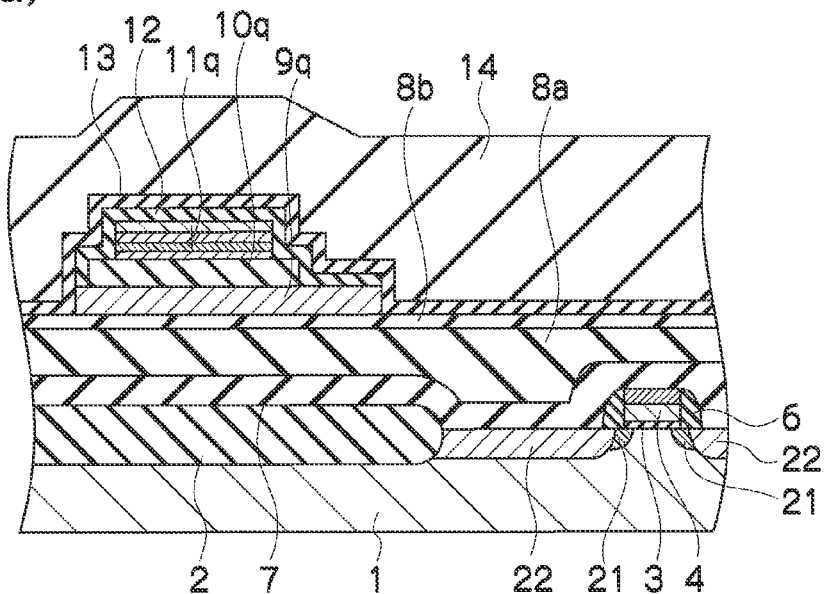
Figure 5B:
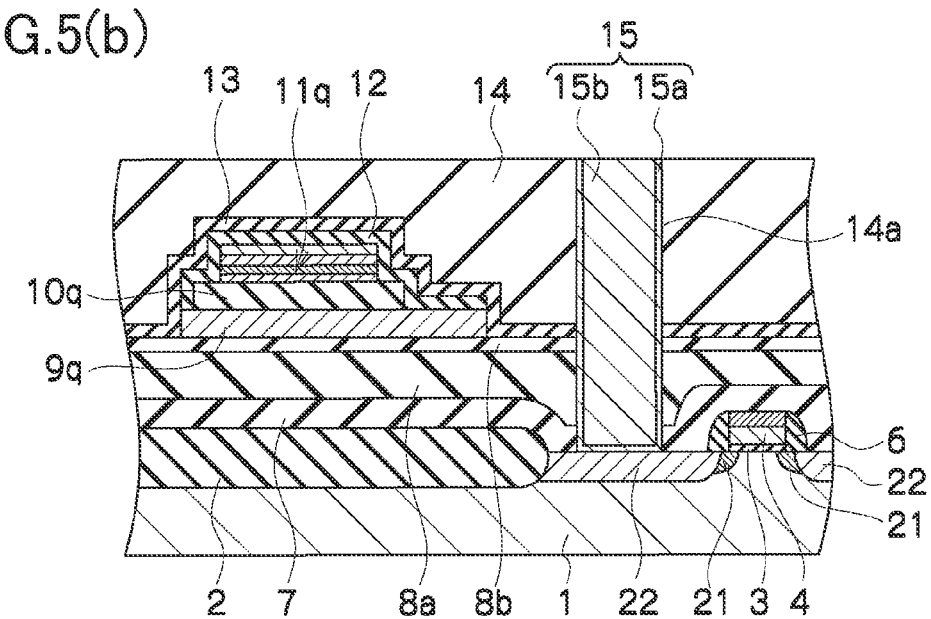

Then, as illustrated in FIG. 5(*a*), a second interlayer insulating film 14 is formed on a whole surface by a high-density plasma method. The second interlayer insulating film 14 is a silicon oxide film formed by using TEOS, and a thickness is set to about 1.5 μm, for example.

Then, an upper surface of the second interlayer insulating film 14 is planarized by the CMP method. Then, the plasma process using $N_2O$ gas is applied to the second interlayer insulating film 14. As a result, a surface layer of the second interlayer insulating film 14 is slightly nitrided, and a moisture is hard to enter into the inside.

In this case, this plasma process is effective if gas in which at least one of N or O is contained is employed.

Then, as illustrated in FIG. 5(*b*), a contact hole 14*a* whose depth reaches the source/drain region 22 of the MOSFETtr is formed in the second interlayer insulating film 14, the second protection film 13, the adhesion film 8*b*, the silicon oxide film 8*a*, and the SiON 7.

Then, a Ti film and a TiN film are formed successively in the contact hole 14*a* as a barrier metal film 15*a* by the sputtering method. Then, a tungsten (W) film 15*b* is filled in the contact hole 14*a* by the CVD method using gas containing tungsten hexafluoride.

Then, the W film 15*b* and the barrier metal film 15*a* are removed from an upper surface of the second interlayer insulating film 14 by the CMP method. Thus, the W film 15*b* and the barrier metal film 15*a* being left in the contact hole 14*a* constitute a conductive plug 15.

Figure 6A:
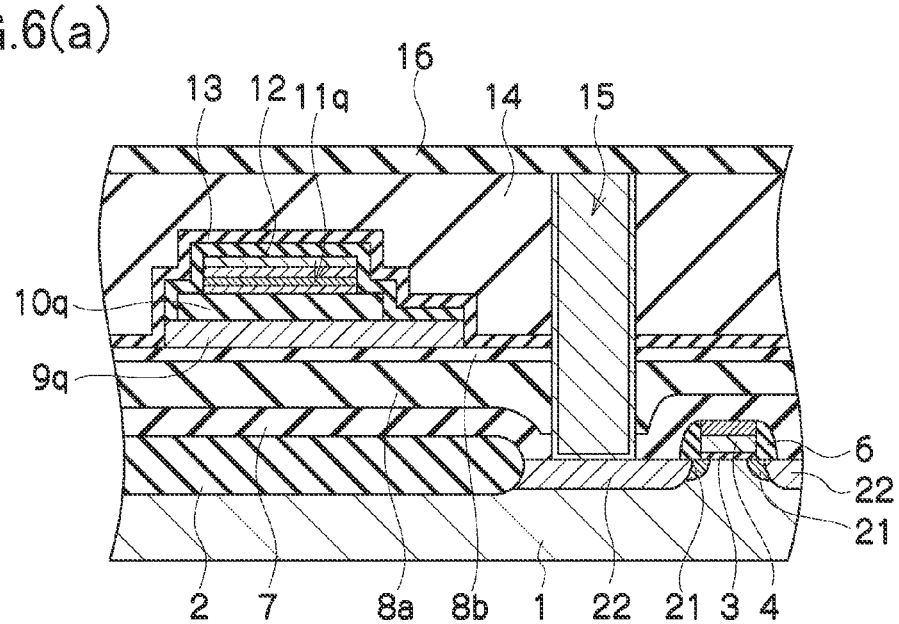
Figure 6B:
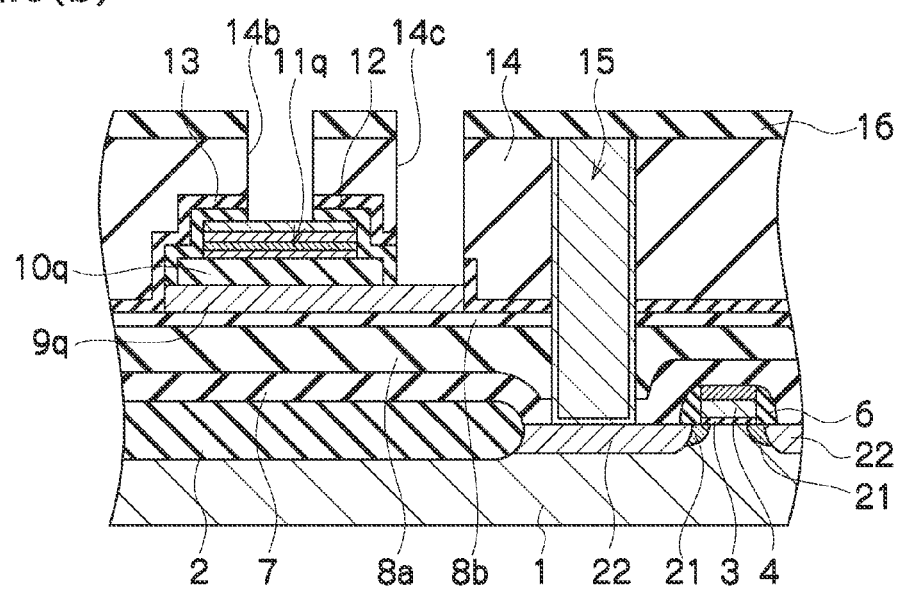

Then, as illustrated in FIG. 6(*a*), an SiON film is formed as an oxidation preventing film 16 of the plug 15 by the plasma-enhanced CVD method, for example.

Then, as illustrated in FIG. 6(*b*), a predetermined area of the SiON film 16, the second interlayer insulating film 14, and the first and second protection films 12, 13 is etched by using a mask (not illustrated). Accordingly, a contact hole 14*b* reaching the capacitor upper electrode 11*q* and a contact hole 14*c* reaching a contact area of the capacitor lower electrode 9*q* are formed respectively.

Then, an oxygen annealing is applied to recover the damage of the capacitor ferroelectric film 10*q*.

Figure 7A:
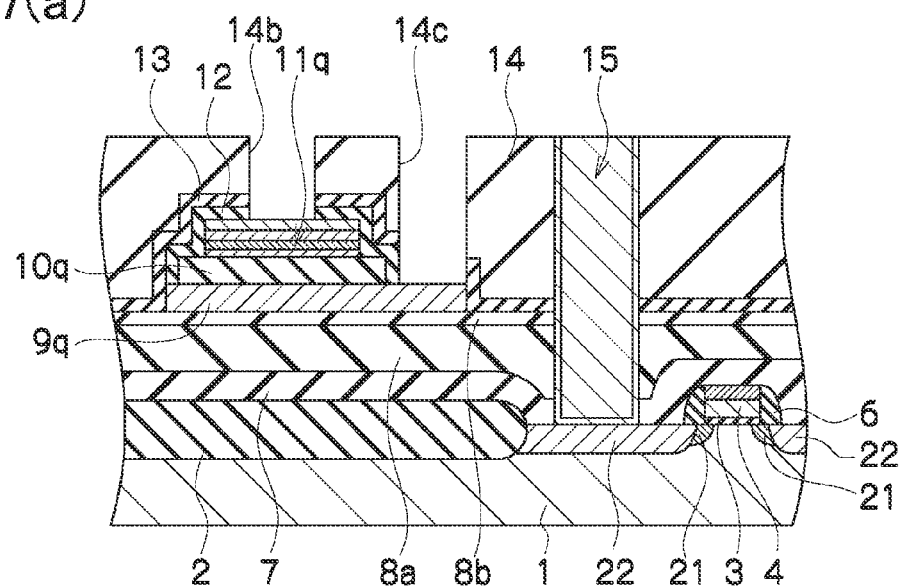
Figure 7B:
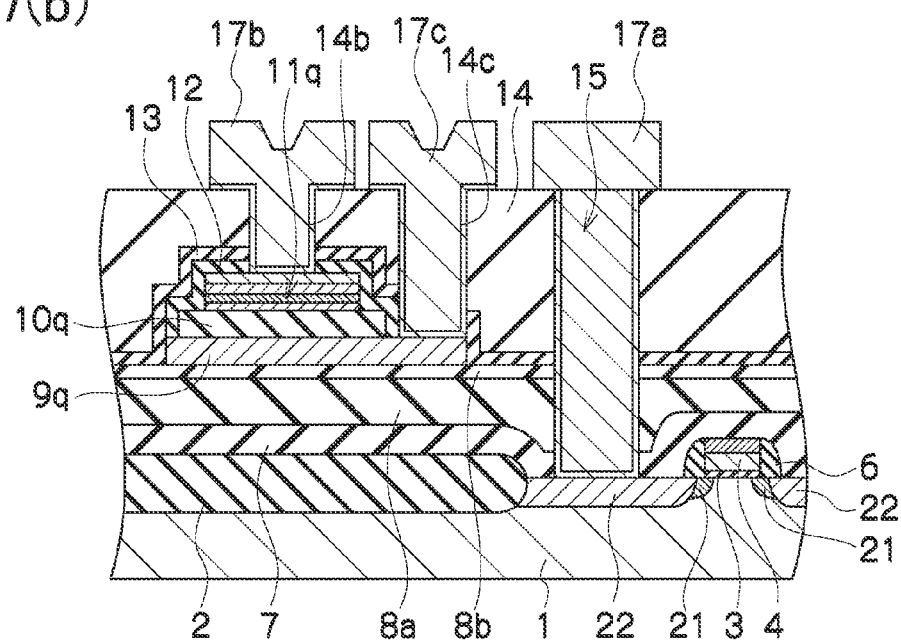

Then, as illustrated in FIG. 7(*a*), the oxidation preventing film 16 is removed over a whole surface by the etching-back. Thus, a surface of the W plug 15 is exposed.

Then, as illustrated in FIG. 7(*b*), a TiN barrier metal film and an Al film are formed in order on the second interlayer insulating film 14 and in the contact holes 14*b*, 14*c* and then Al wirings 17*a* to 17*c* are formed by patterning these films, in such a state that a part of the surface of the capacitor upper electrode 11*q*, and a part of the surface of the capacitor lower electrode 9*q* are exposed through the contact holes 14*b*, 14*c* respectively and also the surface of the plug 15 is exposed.

The first Al wiring 17*a* is connected to the W plug 15, the second Al wiring 17*b* is connected to the capacitor upper electrode 11*q* via the contact hole 14*b*, and the third Al wiring 17*c* is connected to the capacitor lower electrode 9*q* via the contact hole 14*c*.

Then, although not particularly shown, formation of the interlayer insulating film, formation of the contact plug, formation of respective wirings subsequent to the second layer from the bottom, and the like are executed. Then, a cover film formed of a TEOS oxide film and a SiN film, for example, is formed and thus the ferroelectric memory having the ferroelectric capacitor is completed.

In the present embodiment, as described above, the second conductive oxide film 11*b* made of $IrO_y$ whose degree of oxidation is higher than that of the first conductive oxide film 11*a* is formed on the first conductive oxide film 11*a* of the capacitor upper electrode, and then the metal film 11*c* and the metal nitride compound film 11*d* are formed thereon.

Accordingly, the capacitor upper electrode 11*q* may prevent the entering of the moisture or the hydrogen, which is produced when the interlayer film or the wiring contact is formed thereon, by the metal nitride compound film 11*d*. Also, the metal nitride compound such as TiAlN, or the like has the good adhesion to the tiN barrier film constituting the wirings 17*a* to 17*c* and the plugs, and the contact to the capacitor upper electrode 11*q* and the wirings 17*a* to 17*c* may be improved.

Also, the second conductive oxide film 11*b* is grown by a large number of stone wall-like or columnar crystals under the above conditions. Therefore, the abnormal growth of giant crystals and the generation of voids (crumbliness) due to this abnormal growth may be prevented, and the process-deterioration resistant capability of the capacitor may be improved by suppressing the permeation of reducing gas used in the subsequent processes.

Also, the first conductive oxide film 11*a* formed under the above conditions is hard to react with the upper layer of the ferroelectric film 10. Thus, formation of a new layer at the boundary is suppressed.

Therefore, according to the ferroelectric capacitor $Q_1$ constructed by the steps mentioned above, the satisfactory capacitor characteristics may be obtained.

That is, according to the present embodiment, the boundary between the capacitor upper electrode 11*q* and the capacitor ferroelectric film 10*q* may be improved and the process deterioration may be improved. As a result, a quantity of inverted charges may be increased, a coercive electric field may be reduced, and also the fatigue resistance and the imprint resistance may be improved. Also, such ferroelectric capacitor is extremely suitable for the next-generation ferroelectric memory that operates at a low voltage.

By the way, if respective constitutive metals of the first and second conductive oxide films 11*a*, 11*b* are assumed as A, B, the first conductive oxide film 11*a* is expressed by a chemical formula $AO_{x1}$ using an initial composition parameter x1 just after the film formation. Also, the first conductive oxide film 11a is expressed by a chemical formula $AO_{x2}$ using an actual composition parameter x2 in an actual state through the subsequent processes.

Here, A and B may denote either the same constitutive metal or different constitutive metals. As an example in which the different constitutive metals are used, one of A and B is Ir and the other is Ru.

Also, the second conductive oxide film 11b formed on the first conductive oxide film 11a is expressed by an initial chemical formula $BO_{y1}$ using a composition parameter y1 just after the film formation. Also, the second conductive oxide film 11b is expressed by a chemical formula $BO_{y2}$ using an actual composition parameter y2 in an actual state through the subsequent processes. Also, the second conductive oxide film 11b is composed of a large number of microcrystals that are joined like the stone-wall or like the column, and a degree of oxidation of the second conductive oxide film 11b becomes higher than that of the first conductive oxide film 11a. Also, the relation (y2/y1)>(x2/x1) is held among the composition parameters x1, x2, y1, and y2.

That is, even though an amount of oxygen in the capacitor upper electrode 11q is changed from an initial state in the steps of forming the semiconductor device, an oxidation composition of the second conductive oxide film 11b is larger than an oxidation composition of the first conductive oxide film 11a. Also, it is preferable that the composition y1 should be set to 2 or more. The relation among x1, x2, y1, and y2 is similar in second to sixth embodiments described hereunder.

Second Embodiment

A second embodiment of the present invention will be explained hereunder. Here, for convenience of explanation, a sectional structure of respective memory cells of a ferroelectric memory will be explained along with its manufacturing method hereinafter.

FIGS. 8(a), 8(b), 8(c), 9(a), 9(b), 9(c), 10(a), 10(b), 10(c), 11(a), 11(b), 12(a), 12(b), 13(a), 13(b), 14(a), 14(b), 15(a), 15(b), 16(a), 16(b), and 17 are sectional views illustrating a method of manufacturing a ferroelectric memory (semiconductor device) according to a second embodiment of the present invention in order of steps.

Figure 8A:
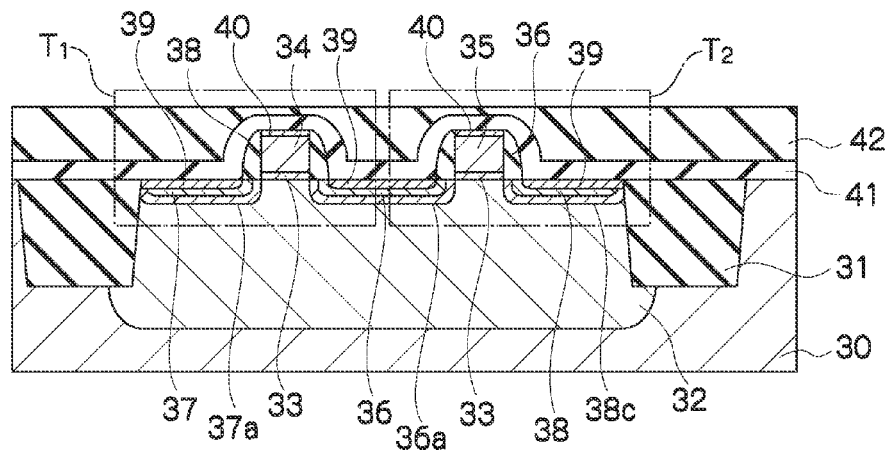
FIGS. 8(*a*), 8(*b*), 8(*c*), 9(*a*), 9(*b*), 9(*c*), 10(*a*), 10(*b*), 10(*c*), 11(*a*), 11(*b*), 12(*a*), 12(*b*), 13(*a*), 13(*b*), 14(*a*), 14(*b*), 15(*a*), 15(*b*), 16(*a*), 16(*b*), and 17 are sectional views illustrating steps of forming a semiconductor device according to a second embodiment of the present invention.

First, forming steps required a structure illustrated in FIG. 8(a) is formed are explained hereunder.

The STI (Shallow Trench Isolation) trenches for defining the active regions of the transistors are formed on a surface of an n-type or p-type silicon (semiconductor) substrate 30, and then an element isolation insulating film 31 is formed by filling an insulating film such as silicon oxide, or the like in the trenches. In this case, the structure of the element isolation insulating film 31 is not limited to STI, and may be formed by the LOCOS method.

Then, a p-well 32 is formed by introducing a p-type impurity into the active region of the silicon substrate 30. Then, a thermal oxidation film is formed as gate insulating film 33 by thermally oxidizing a surface of the active region.

Then, an amorphous or polysilicon is formed on the whole upper surface of the element isolation insulating film 31. Then, two gate electrodes 34, 35 are formed by patterning these films by virtue of the photolithography method.

Two gate electrodes 34, 35 are arranged in parallel at an interval on the p-well 32. These gate electrodes 34, 35 constitute a part of word lines.

Then, an n-type impurity is introduced into the silicon substrate 30 beside the gate electrodes 34, 35 by the ion implantation using the gate electrodes 34, 35 as a mask. Thus, first and second source/drain extension regions 36a, 37a are formed.

Then, an insulating film is formed on the whole upper surface of the silicon substrate 30, and then an insulating sidewall 39 is left on side surfaces of the gate electrodes 34, 35 by etching back the insulating film. As the insulating film, a silicon oxide film is formed by the CVD method, for example.

Then, an n-type impurity is ion-implanted again into the silicon substrate 30 while using the insulating sidewalls 39 and the gate electrodes 34, 35 as a mask. Thus, source/drain regions (impurity diffusion regions) 36, 37, 38 are formed on a surface layer of the silicon substrate 30 on both sides of two gate electrodes 34, 35.

In this manner, first and second MOS transistor $T_1$, $T_2$ are constructed by the gate insulating film, the gate electrodes 34, 35, the source/drain regions 36, 37, 38, which are formed in the active region of the silicon substrate 30.

Then, a refractory metal layer such as a cobalt layer, or the like is formed on the whole upper surface of the silicon substrate 30 by the sputter method. Then, a refractory metal silicide layer 39 is formed on a surface layer of the source/drain regions 36, 37, 38 by heating the refractory metal layer to react with the silicon. In this step, a refractory metal silicide layer 40 is also formed on a surface layer portion of the gate electrodes 34, 35, whereby a resistance of the gate electrodes 34, 35 is lowered. The refractory metal layer that has not been reacted on the element isolation insulating film 31 and the like is removed by the wet etching.

Then, a SiON film of about 200 nm thickness is formed as a cover insulating film 41 by the plasma CVD method. Then, a silicon oxide film of about 1000 nm thickness is formed as a first interlayer insulating film 42 on the cover insulating film 41. The silicon oxide film is formed by the plasma CVD method using a TEOS gas.

Then, an upper surface of the first interlayer insulating film 42 is polished by the CMP method and is planarized. As the result of this CMP, a thickness of the first interlayer insulating film 42 is set to about 700 nm on the flat surface of the silicon substrate 30.

Figure 8B:
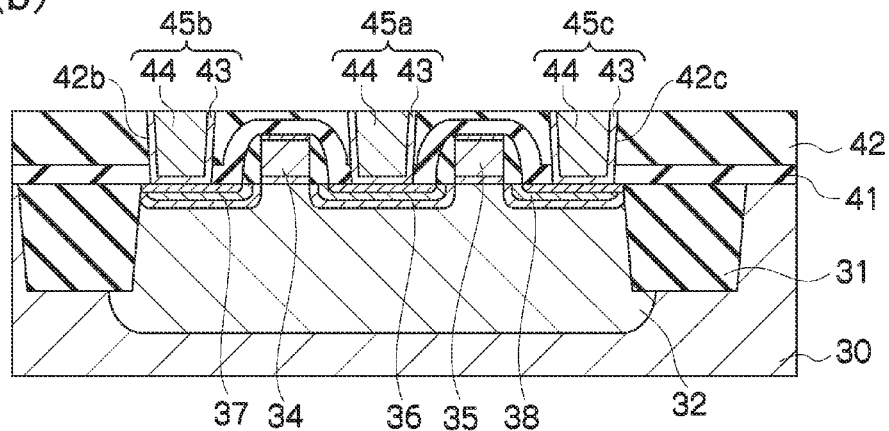

Then, as illustrated in FIG. 8(b), the cover insulating film 41 and the first interlayer insulating film 42 are patterned by the photolithography method. Thus, first to third contact holes 42a to 42c, whose diameter is 0.25 μm and from which the first to third source/drain regions 36 to 38 are exposed respectively, are formed. Then, the conductive plugs 45a to 45c are formed in theses contact holes.

In the steps of forming the conductive plugs 45a to 45c, a Ti film of 30 nm thickness and a TiN film of 20 nm thickness are stacked in order in the first to third contact holes 42a to 42c respectively to constitute a first adhesion film (glue film) 43. Then, a first W film 44 is grown on the first adhesion film 43 by the CVD method, and thus the first W film 44 is filled in the first to third contact holes 42a to 42c. The first W film 44 is grown on the flat surface of the first interlayer insulating film 42 to have a thickness of about 300 nm.

Then, the extra first adhesion film 43 and the extra first W film 44 left on the upper surface of the first interlayer insulating film 42 are removed by the CMP method. Accordingly, the first adhesion film 43 and the first W film 44 left in the first to third contact holes 42a to 42c respectively constitute the first to third conductive plugs 45a to 45c.

Figure 8C:
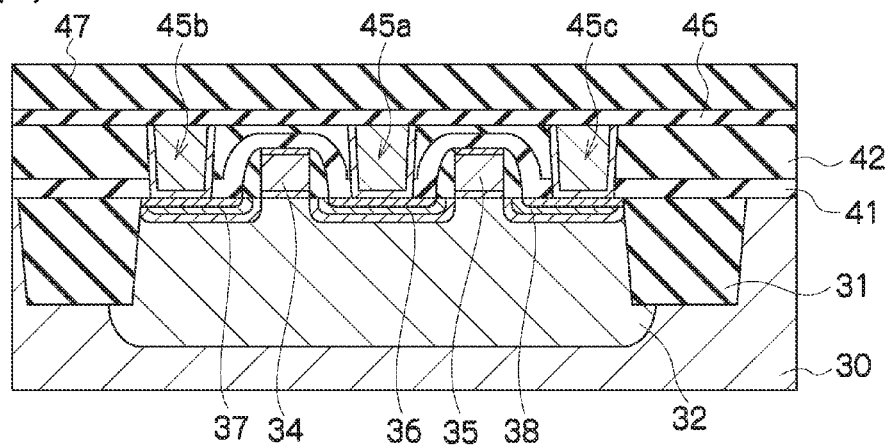

Then, as illustrated in FIG. 8(c), an oxidation preventing film 46 made of SiON is formed on the first to third conductive plugs 45a to 45c and the first interlayer insulating film 42 by the plasma CVD method to have a film thickness of 130 nm, for example. Then, a silicon oxide film is formed as a second interlayer insulating film 47 on the oxidation preventing film 46 to have a film thickness of 300 nm, for example. The silicon oxide film is formed by the plasma CVD method using TEOS as the material to have a film thickness of 300 nm, for example.

In this case, as the oxidation preventing film 46, a SiN film or an aluminum oxide ($Al_2O_3$) film may be formed instead of the SiON film.

Then, as illustrated in FIG. 9(*a*), the second interlayer insulating film 47 and the oxidation preventing film 46 are patterned. Thus, fourth and fifth contact holes 48*b*, 48*c* are formed on the second and third conductive plugs 45*b*, 45*c* near both sides of the p-well 32.

Then, a second adhesion film 49 and a second W film 50 are formed in order in the fourth and fifth contact holes 48*b*, 48*c* under the same conditions as those applied to the first adhesion film 43 and the first W film 44. Then, the second W film 50 and the second adhesion film 49 are removed from an upper surface of the second interlayer insulating film 47 by the CMP.

In this CMP, the slurry that renders a polishing speed of the second adhesion film 49 and the second W film 50 as the polished object faster than a polishing speed of the underlying second interlayer insulating film 47, e.g., the product SSW2000 manufactured by Cabot Microelectronics Corporation, is employed.

Then, in order not to leave the polishing residue on the second interlayer insulating film 47, a polishing depth in this CMP is set thicker than a total film thickness of the second adhesion film 49 and the second W film 50. That is, this CMP is done as an over-polishing.

Accordingly, the second W film 50 and the second adhesion film 49 left in the fourth and fifth contact holes 48*b*, 48*c* provide fourth and fifth conductive plugs 51, 52 respectively. The fourth and fifth conductive plugs 51, 52 are connected to the second and third source/drain regions 37, 38 via the underlying conductive plugs 45*b*, 45*c* respectively.

Then, NH group produced by the ammonia ($NH_3$) plasma is bonded to the oxygen atoms on the surface of the second interlayer insulating film 47.

Hence, even when Ti atom produced thereafter is further stacked on the second interlayer insulating film 47, the stacked Ti atom is never captured by the oxygen atom. Accordingly, the Ti atom may move freely on the surface of the second interlayer insulating film 47. As a result, the Ti film that is self-organized in the (002) orientation is formed on the second interlayer insulating film 47.

In this ammonia plasma process, the parallel-plate plasma processing equipment in which the opposing electrodes are provided in positions that is separated from the semiconductor substrate 30 by about 9 mm (350 mils), for example, is employed. As the process conditions, for example, an ammonia gas is supplied at a flow rate of 350 sccm to the processing vessel that is held at a substrate temperature of 400° C. at a pressure of 266 Pa (2 Torr), a high-frequency power of 100 W is applied to the processed substrate side at 13.56 MHz, and a high-frequency power of 55 W is applied to the opposing electrodes at 350 kHz.

Then, for example, an interior of the chamber of the sputter equipment, in which a distance between the semiconductor substrate 30 and a target is set to 60 mm, is set to an Ar atmosphere at 0.15 Pa, and a DC sputter power of 1.4 kW is supplied for 14 sec at a substrate temperature of 150° C. Accordingly, the Ti film aligned in the strong (002) orientation is formed to have a thickness of 20 nm, for example.

Then, the Ti film is thermally treated at 650° C. for 60 sec in a nitrogen atmosphere by the RTA. As illustrated in FIG. 9(*b*), the Ti film is changed into an underlying conductive film 53 made of TiN having the (111) orientation. It is preferable that a thickness of this underlying conductive film 53 should be set to 10 nm to 50 nm. In the present embodiment, this thickness is set to about 20 nm. This underlying conductive film 53 has a function of improving a crystallinity of the film formed thereon.

In this case, the underlying conductive film 53 is not limited to the titanium nitride film. Any one of a tungsten film, a silicon film, and a copper film may be formed.

Then, as illustrated in FIG. 9(*c*), a TiAlN film of 100 nm thickness, for example, is formed as an oxygen diffusion barrier film 54 on the underlying conductive film 53 by the reactive sputter. As the sputter conditions applied to form the oxygen diffusion barrier film 54, a target in which Ti and Al are alloyed is employed, Ar and nitrogen are introduced into the sputter atmosphere by 40 sccm and 10 sccm respectively, an interior of the sputter atmosphere is set to a pressure of 253.3 Pa, a substrate temperature is set to 400° C., and a sputter power is set to 1.0 kW.

Then, as illustrated in FIG. 10(*a*), a lower electrode film 55 and a ferroelectric film 56 are formed in sequence on the oxygen diffusion barrier film 54.

As the lower electrode film 55, an Ir film of 100 nm thickness is formed by the sputter. As the sputter conditions for forming the lower electrode film 55, an Ir target is set in an Ar atmosphere, an interior of the sputter atmosphere is set to a pressure of 0.11 Pa, a substrate temperature is set to 500° C., and a sputter power is set to 0.5 kW.

After the lower electrode film 55 is formed, the silicon substrate 30 is annealed at 650° C. for 60 sec in an Ar atmosphere by RTA. According to this annealing, the adhesion between the lower electrode film 55, the oxygen diffusion barrier film 54, and the underlying conductive film 53 may be improved, and simultaneously the crystallinity of the lower electrode film 55 may be improved. An atmosphere of the annealing process is not limited to Ar, and an inert gas, e.g., $N_2$, He, or the like may be employed.

Here, as the lower electrode film 55, platinum-group metal such as Pt, or the like, or conductive oxide such as PtO, $IrO_x$, $SrRuO_3$, or the like may be employed instead of the Ir film. Also, the lower electrode film 55 may be formed of a stacked film containing the above metal or metallic oxide.

As the ferroelectric film 56, for example, a PZT film is formed on the lower electrode film 55 by the MOCVD method. More concretely, the PZT film is formed in steps described as follows.

First, $Pb(DPM)_2$, $Zr(DMHD)_4$, and $Ti(O\text{-}iPr)_2(DPM)_2$ are dissolved in tetrahydrofuran (THF) solvent up to a concentration of 0.3 mol/l respectively to prepare respective liquid materials of Pb, Zr, and Ti. Then, these three liquid materials are fed to a vaporizer of the MOCVD equipment at a flow rate of 0.326 ml/min, 0.200 ml/min, and 0.200 ml/min respectively together with the THF solvent whose flow rate is set to 0.474 ml/min, and are vaporized in the vaporizer. Thus, material gases of Pb, Zr, and Ti are produced.

Then, a pressure in a chamber of the MOCVD equipment is set to 665 Pa (5 Torr), and a substrate temperature is held at 620° C. Then, the material gases of Pb, Zr, and Ti are introduced into the chamber of the MOCVD equipment for 620 sec. Thus, a desired PZT film of about 100 nm thickness is formed on the lower electrode film 55.

In this case, it is desirable that the annealing should be applied to the PZT film at a temperature of 600° C. to 620° C. for 60 sec in an atmosphere containing oxygen. This annealing evaporates impurities that are adsorbed on the surface of the PZT film, and improves the characteristic of the capacitor.

Then, an amorphous ferroelectric film is formed on the whole surface of the PZT film by the sputter method, for example. As the amorphous ferroelectric film, a ferroelectric film of 1 nm to 30 nm (e.g., 20 nm) thickness, for example, is formed. When the ferroelectric film is formed by the MOCVD equipment, for example, the material obtained by dissolving $Pb(DPM)_2(Pb(C_{11}H_{19}O_2)_2)$ in the THF liquid is employed as an organic source for supplying lead (Pb). Also, the material obtained by dissolving $Zr(DMHD)_4(Zr(C_9H_{15}O_2)_4)$ in the THF liquid is employed as an organic source for supplying zirconium (Zr). Also, the material obtained by dissolving $Ti(O-iPr)_2(DPM)_2(Ti(C_3H_7O)_2(C_{11}H_{19}O_2)_2)$ in the THF liquid is employed as an organic source for supplying titanium (Ti).

Figure 10A:
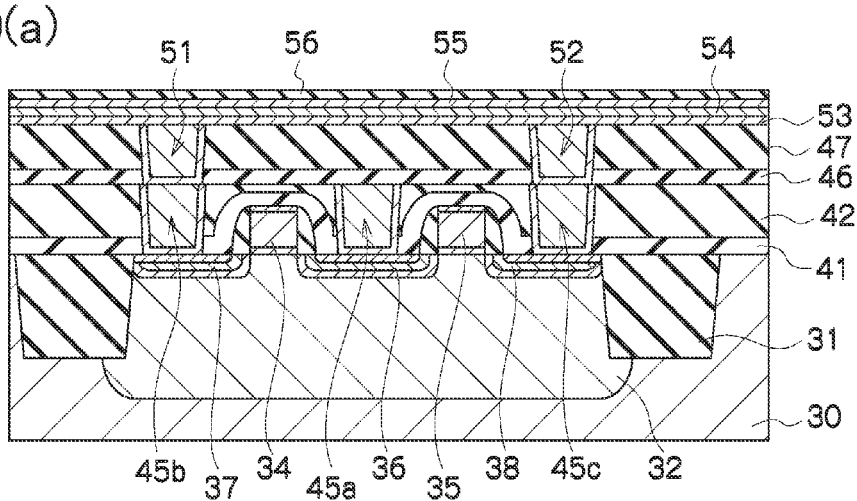
Figure 10B:
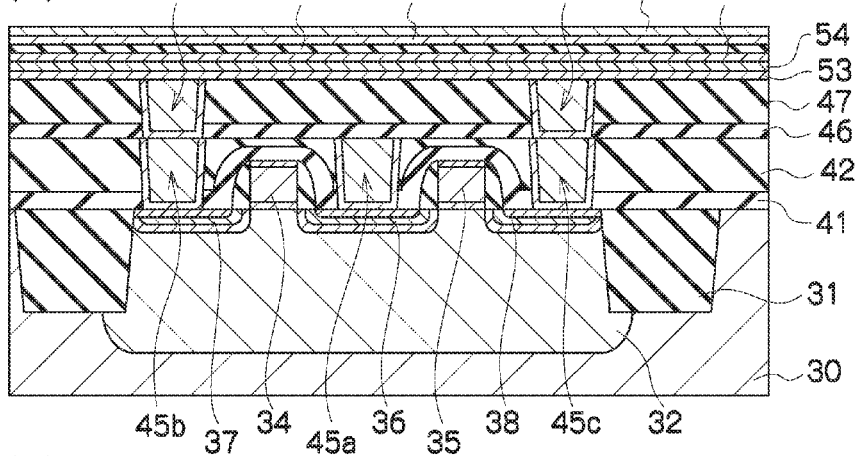
Figure 10C:
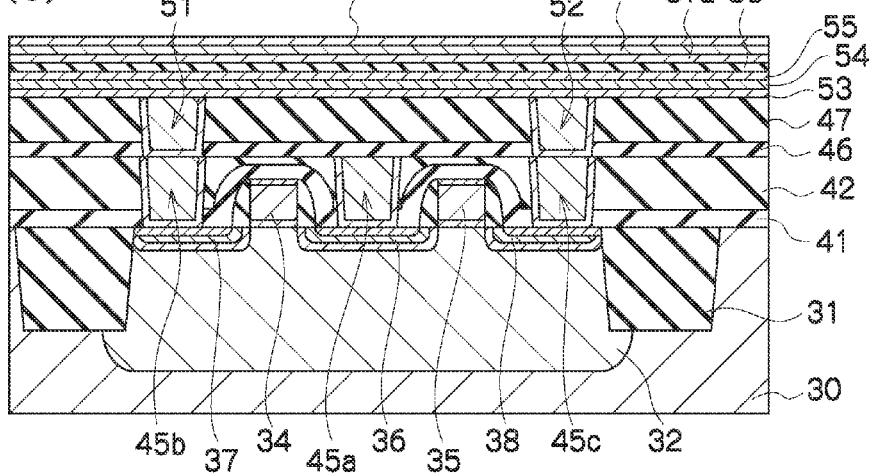
Figure 11A:
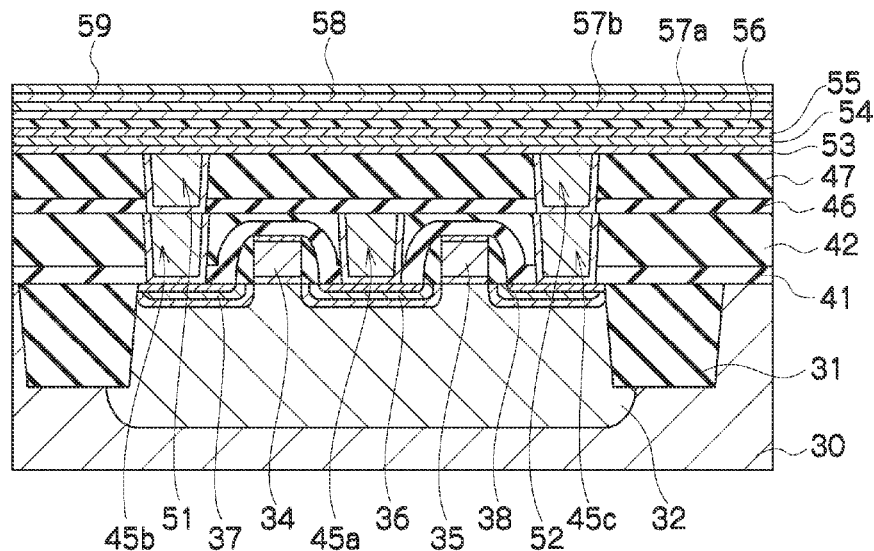

Then, as illustrated in FIGS. 10(b), 10(c), and 11(a), an upper electrode film consisting of a conductive oxide film having a two-layered structure, a metal film, and a metal nitride compound film is formed on the ferroelectric film 56. The metal nitride compound film is formed to prevent a hydrogen diffusion.

Then, as illustrated in FIG. 10(b), a first conductive oxide film 57a and a second conductive oxide film 57b are formed in order on the ferroelectric film 56.

As the first conductive oxide film 57a, for example, the $IrO_x$ film that is crystallized at a point of time of film formation is formed by the sputter method to have a thickness of 20 nm to 70 nm, e.g., 25 nm. As the film forming conditions, for example, a film forming temperature is set to 300° C., Ar and $O_2$ are employed as a film forming gas, a flow rate of Ar is set to 140 sccm, a flow rate of $O_2$ is set to 60 sccm, and a sputter power is set to about 1.0 kW to 2 kW. The $IrO_x$ formed under these conditions has the crystals that are bonded like the stone wall.

Then, the silicon substrate 30 is annealed in a heating chamber by the RTA method. This annealing may crystallize completely the ferroelectric film 56, compensate the oxygen defect in the PZT film constituting the ferroelectric film 56, and also recover a film quality of the first conductive oxide film 57a that was subjected to the plasma damage. As the conditions for the RTA method, a temperature of the substrate put in a heating atmosphere is set to 725° C., oxygen and Ar are introduced into the heating atmosphere at a flow rate of 200 sccm and 1800 sccm respectively, and an annealing time is set to 60 sec.

Then, the second conductive oxide film 57b made of $IrO_y$ and having a thickness of 50 nm to 200 nm is formed on the first conductive oxide film 57a made of $IrO_x$ by the sputter method. As the film forming conditions, the semiconductor substrate 30 is put in the Ar and $O_2$ atmosphere whose pressure is set to 0.8 Pa, and then $IrO_y$ is grown up to a thickness of about 100 nm when the sputter is applied in the conditions that an Ir target is used, a sputter power is set to 1.0 kW, and a film forming time is set to 39 sec.

At this time, a film forming temperature of $IrO_y$ is set to a temperature range of 30° C. or more but 100° C. or less, preferably a temperature range of 50° C. or more but 75° C. or less. In such conditions, the $IrO_y$ in the second conductive oxide film 57b is microcrystallized at a time point of film formation and a large number of microcrystals are bonded like stone wall or column. In addition, the abnormal growth caused by the subsequent annealing may be prevented.

The Ir target and the Ar and $O_2$ gases are employed in forming the second conductive oxide film 57b. It is assumed that a rate of $O_2$ to Ar at that time is set higher than a rate in forming the first conductive oxide film 57. As the flow rate of the gases in forming the $IrO_y$ film, for example, a flow rate of Ar is set to 100 sccm and a flow rate of $O_2$ is set to 100 sccm. Also, a sputter power is set to about 1 kW, for example.

The second conductive oxide film 57b made of $IrO_y$ and formed under the above conditions contains no abnormal oxidation and, thus the fine crystal film could be obtained. At this time, like the first embodiment, the $IrO_y$ film has a composition close to a stoichiometric composition of $IrO_2$ to suppress the process deterioration. As a result, a function of catalyst for the hydrogen is hard to occur, such a problem is suppressed that the ferroelectric film is reduced by hydrogen radical, and a hydrogen resistance of the capacitor is improved.

In this case, as the material of the first and second conductive oxide films 57a, 57b, a stacked structure formed of materials selected from platinum (Pt), iridium (Ir), ruthenium (Ru), rhodium (Rh), rhenium (Re), osmium (Os), palladium (Pd) or its oxide, and a conductive oxide such as $SrRuO_3$, or the like or any material selected from the above as other noble metals may be employed.

In this case, the noble metals constituting the first and second conductive oxide films 57a, 57b may be formed of the same element or the different element respectively. Also, the first and second conductive oxide films 57a, 57b are the conductive film that has a smaller catalytic action of reducing gas than platinum respectively.

Then, the silicon substrate 30 is annealed by the RTA method. As the conditions, for example, a substrate temperature is set to 700° C., $O_2$ and Ar are introduced into the atmosphere at a flow rate of 20 sccm and 2000 sccm respectively, and an annealing time of the substrate is set to 60 sec. According to this annealing, the adhesion of the ferroelectric film 56 and the first and second conductive oxide films 57a, 57b may be improved, the crystallinity of the second conductive oxide film 57b may be stabilized, and also the defect such as the oxygen defect, or the like may be eliminated.

Then, as illustrated in FIG. 10(c), a metal film 58 made of Ir whose thickness is 20 nm to 100 nm, e.g., 50 nm, is formed on the second conductive oxide film 57b by the sputter. As the growth conditions by the Ir sputter method, for example, a substrate temperature is set to 400° C., and a sputter power is set to 1.0 kW in the film forming atmosphere whose pressure is 1 Pa. In this case, Ru, and other noble metals may be formed instead of Ir.

Then, as illustrated in FIG. 11(a), a TiAlN film of 50 nm to 100 nm thickness, for example, is formed as the metal nitride compound film 59 on the metal film 58 by the reactive sputter method. As the sputter conditions applied to form the metal nitride compound film 59, a target in which Ti and Al are alloyed is used, Ar and nitrogen are introduced into the sputter atmosphere at 40 sccm and 20 sccm respectively, a pressure in the sputter atmosphere is set to 253.3 Pa, a substrate temperature is set to 400° C., and a sputter power is set to 1.0 kW.

In this case, like the first embodiment, as the metal nitride compound film 59, not only the TiAlN film but also other film selected from a group consisting a TaAlN film, a TaAlON film, a TiAlON film, and the like may be employed.

The first conductive oxide film 57a made of $IrO_x$, the second conductive oxide film 57b made of $IrO_y$, and the metal film 58 made of the noble metal, and the metal nitride compound film 59 constitute together a capacitor upper electrode film.

Figure 11B:
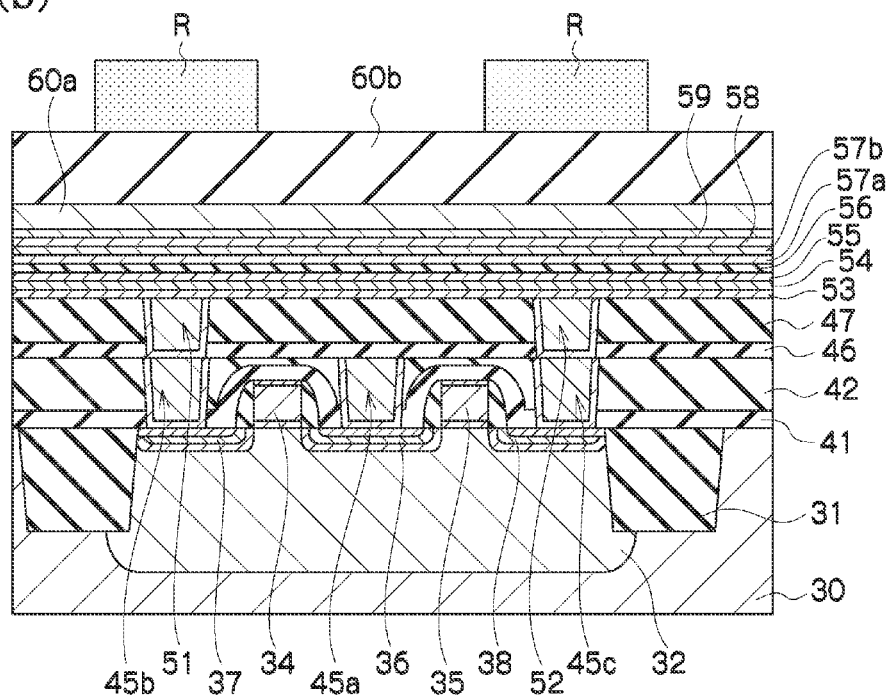

After the back surface of the silicon substrate 30 is rinsed, as illustrated in FIG. 11(b), an alumina ($Al_2O_3$) film of 20 nm thickness and a titanium nitride film of 200 nm thickness are formed as a first mask material layer 60a on the metal film 59 constituting the upper electrode by the sputter method. Then, a silicon oxide film is formed as a second mask material layer 60b on the first mask material layer 60a by the CVD method using TEOS gas.

Then, a photo resist is coated on the second mask material layer 60b, and then exposed/developed. Thus, an island-like resist pattern R having a capacitor planar shape is formed on the fourth and fifth conductive plugs 51, 52. Then, the second mask material layer 60b is patterned while using the resist pattern R as a mask. Then, the first mask material layer 60a is etched while using the patterned second mask material layer 60b as a mask.

Figure 12A:
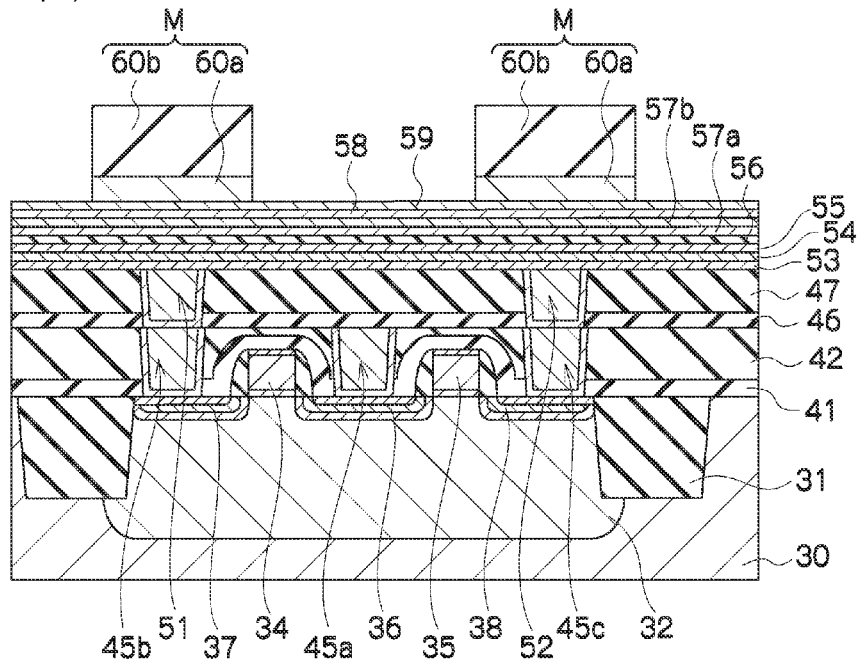

As illustrated in FIG. 12(a), the first and second mask material layers 60a, 60b that are patterned are used as a hard mask M. The resist pattern R is removed after the first mask material layer 60a is etched.

Figure 12B:
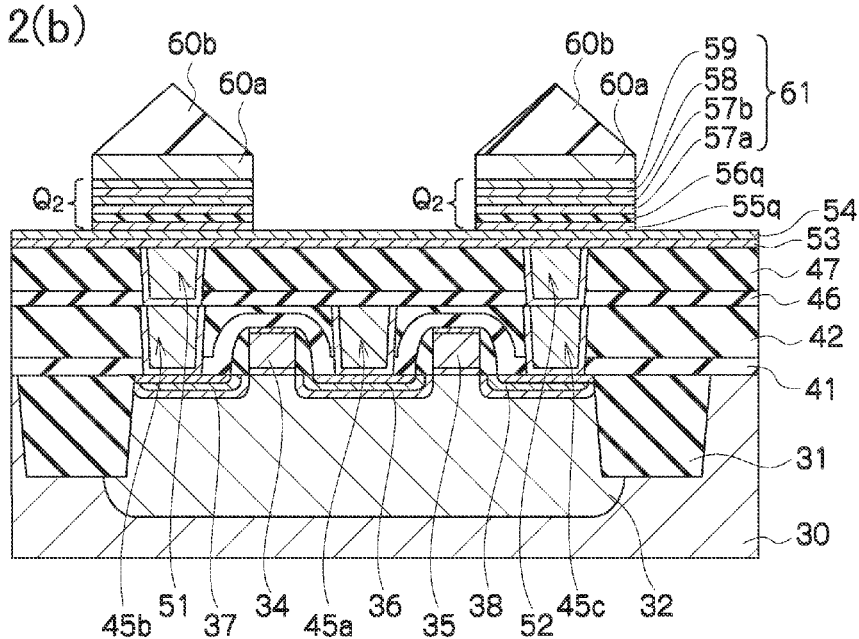

Then, as illustrated in FIG. 12(b), respective portions, which are not covered with the hard mask M, of the upper electrode films 57a, 57b, 58, 59, the PZT film 56, and the lower electrode film 55 are dry-etched by the plasma etching using mixed gas consisting of HBr, $O_2$, Ar, and $C_4F_8$ as an etching gas.

Accordingly, the patterned upper electrode films 57a, 57b, 58, 59 constitute a capacitor upper electrode 61, the patterned ferroelectric film 56 constitutes a capacitor dielectric film 56q, and the patterned lower electrode film 55 constitutes a capacitor lower electrode 55q. A ferroelectric capacitor $Q_2$ is constructed by the capacitor upper electrode 61, the capacitor dielectric film 56q, and the capacitor lower electrode 55q.

Figure 13A:
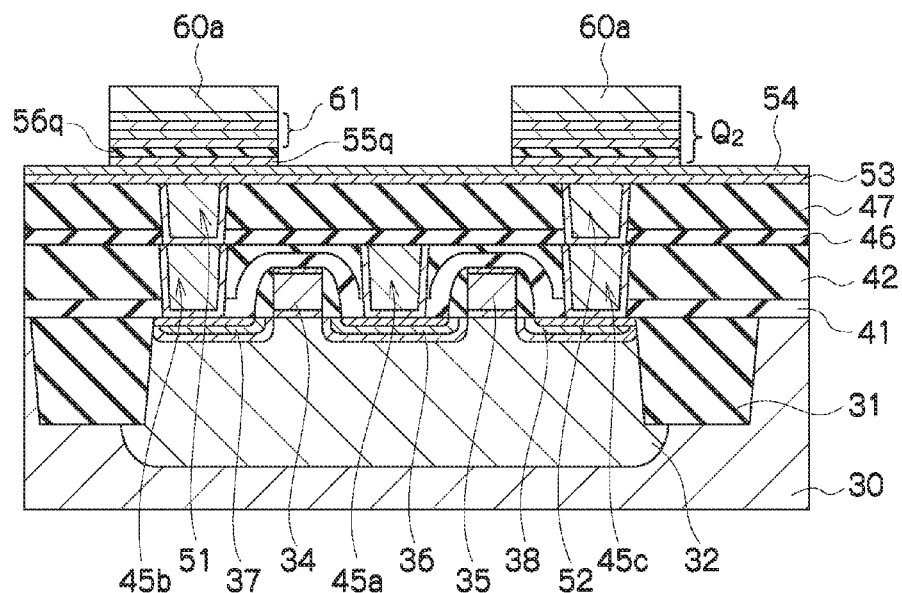

Then, as illustrated in FIG. 13(a), the second mask material layer 60b is removed by the dry etching or the wet etching. For example, hydrofluoric acid is used as the wet etching.

Figure 13B:
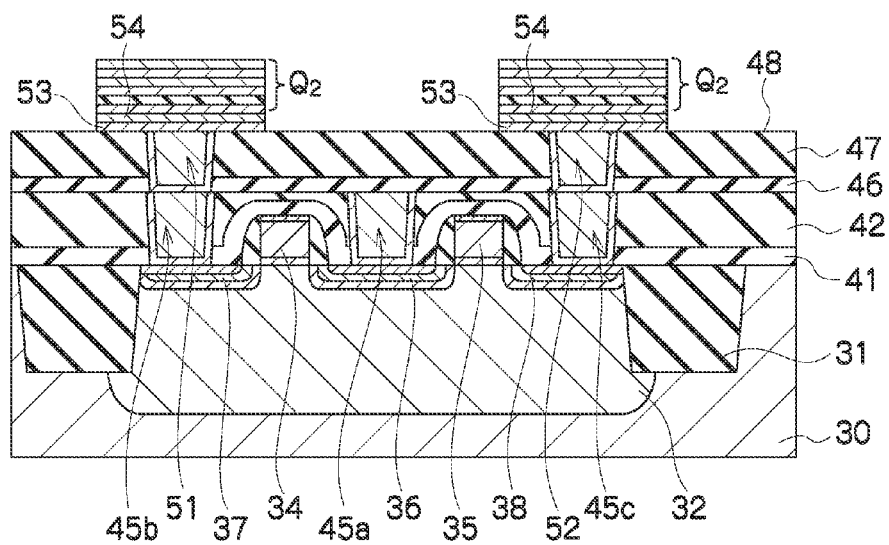

Then, as illustrated in FIG. 13(b), respective portions, which are not covered with the ferroelectric capacitor $Q_2$, of the oxygen diffusion barrier film 54, the underlying conductive film 53, and the first mask material layer 60a are removed by the dry etching.

Figure 14A:
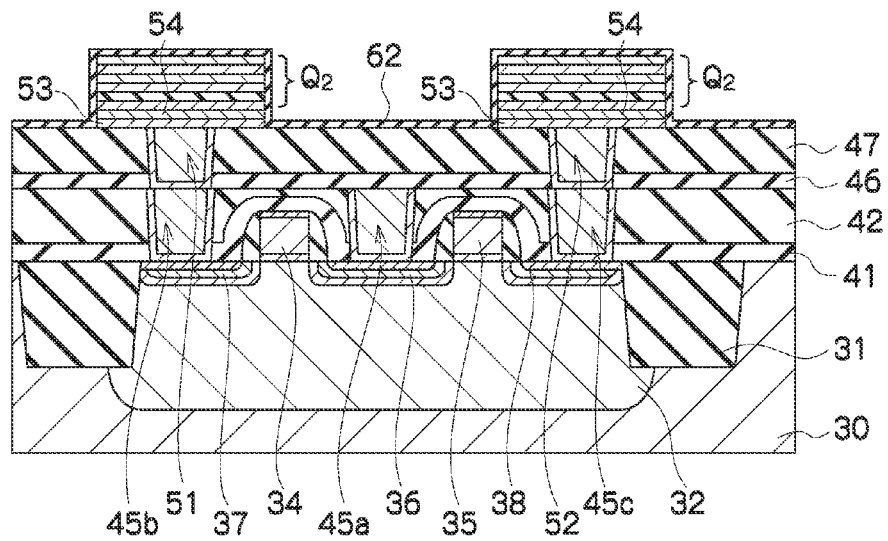

Then, as illustrated in FIG. 14(a), a first protection insulating film 62 made of $Al_2O_3$ and having a thickness of 20 nm is formed by the sputter method to cover the ferroelectric capacitor $Q_2$. In this case, as the first protection insulating film 62, an alumina film of 2 nm thickness may be formed by the ALD (Atomic Layer Deposition) method or a PZT film or a $TiO_x$ film may be formed by the sputter method.

Figure 14B:
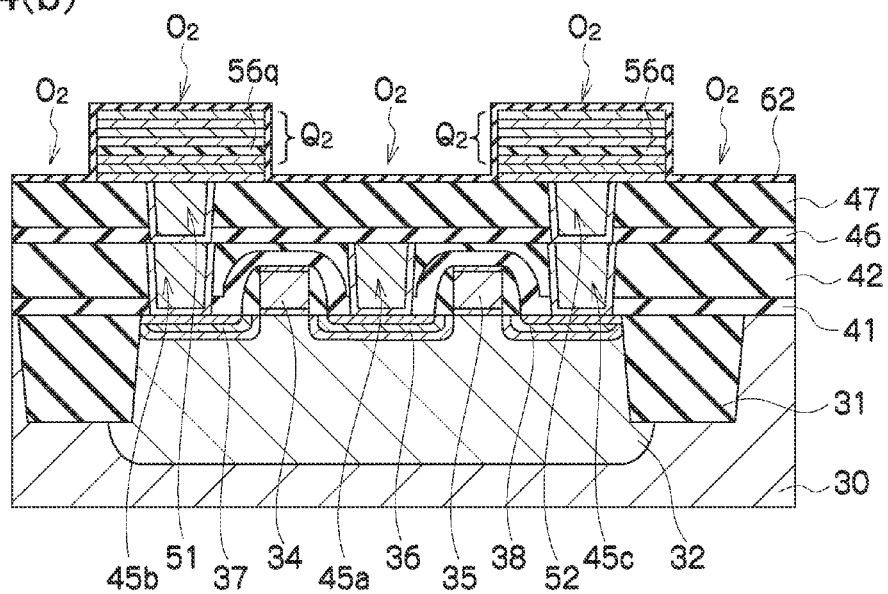

Then, as illustrated in FIG. 14(b), for the purpose of recovering a film quality of the capacitor dielectric film 56q that was damaged, a recovery annealing is applied to the capacitor dielectric film 56q in an oxygen-containing atmosphere. The conditions of this recovery annealing are not particularly limited. In the present embodiment, this annealing is performed at a substrate temperature of 550° C. to 700° C. in a heating furnace. Also, in case the capacitor dielectric film 56q is formed of PZT, it is desirable that the annealing should be applied at a substrate temperature of 600° C. for 60 min in an oxygen atmosphere.

Figure 15A:
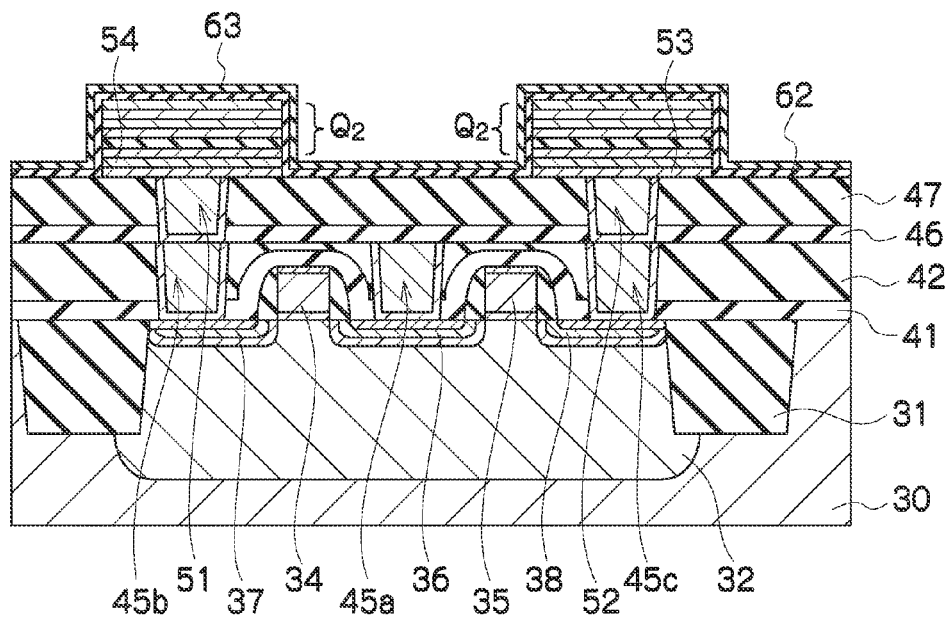

Then, as illustrated in FIG. 15(a), a second protection insulating film 63 for covering the first protection insulating film 62 and the ferroelectric capacitors $Q_2$ is formed. The second protection insulating film 63 functions as a hydrogen barrier film. In this case, as the second protection insulating film 63, alumina in about 40 nm thick may be formed by the CVD method.

Figure 15B:
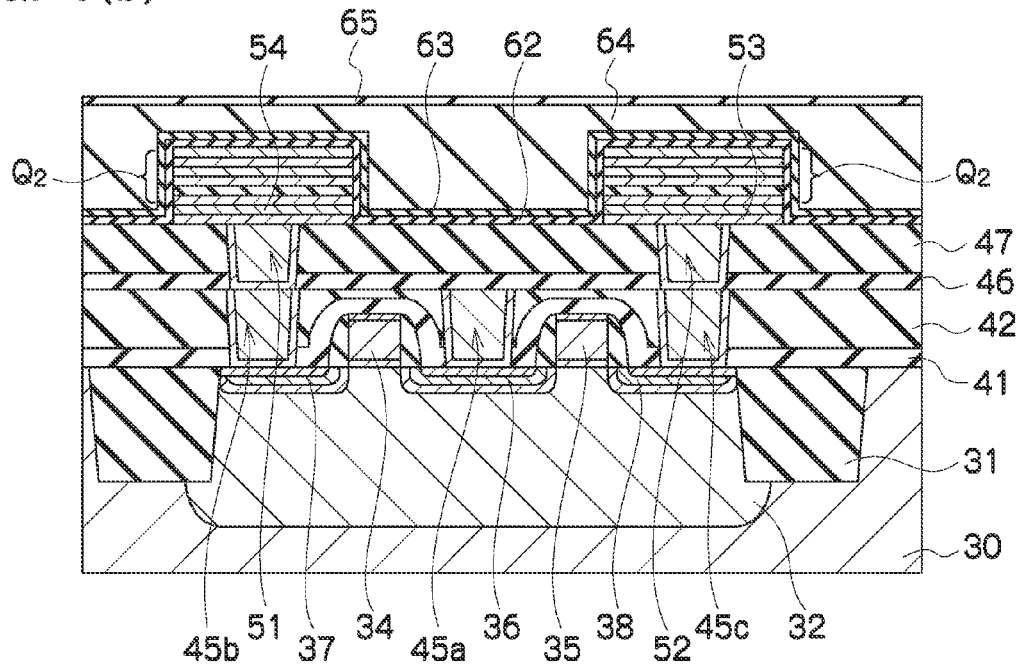

Then, as illustrated in FIG. 15(b), a third interlayer insulating layer 64 formed of a silicon oxide whose film thickness is 1500 nm, for example, is formed on the second protection insulating film 63. The silicon oxide is formed on the whole surface of the substrate by the plasma CVD method, for example. As material gas, mixed gas of TEOS gas, oxygen gas, and helium gas, for example, is employed. In this case, as the third interlayer insulating layer 64, an inorganic film having an insulating property, or the like, for example, may be formed.

Then, a surface of the third interlayer insulating layer 64 is planarized by the CMP method, for example. Then, the heat treatment is applied to the third interlayer insulating layer 64 in a plasma atmosphere that is produced by using $N_2O$ gas, $N_2$ gas, or the like. As the result of the heat treatment, a moisture in the third interlayer insulating layer 64 is removed, and a film quality of the third interlayer insulating layer 64 is reformed and it is difficult for a moisture to enter into the film.

Then, a barrier film 65, i.e., third protection insulating film is formed on the whole surface of the third interlayer insulating layer 64 by the sputter method or the CVD method, for example. As the barrier film 65, an aluminum oxide film whose film thickness is 20 nm to 100 nm, for example, is formed. The barrier film 65 formed on the planarized third interlayer insulating layer 64 is formed flat.

Figure 16A:
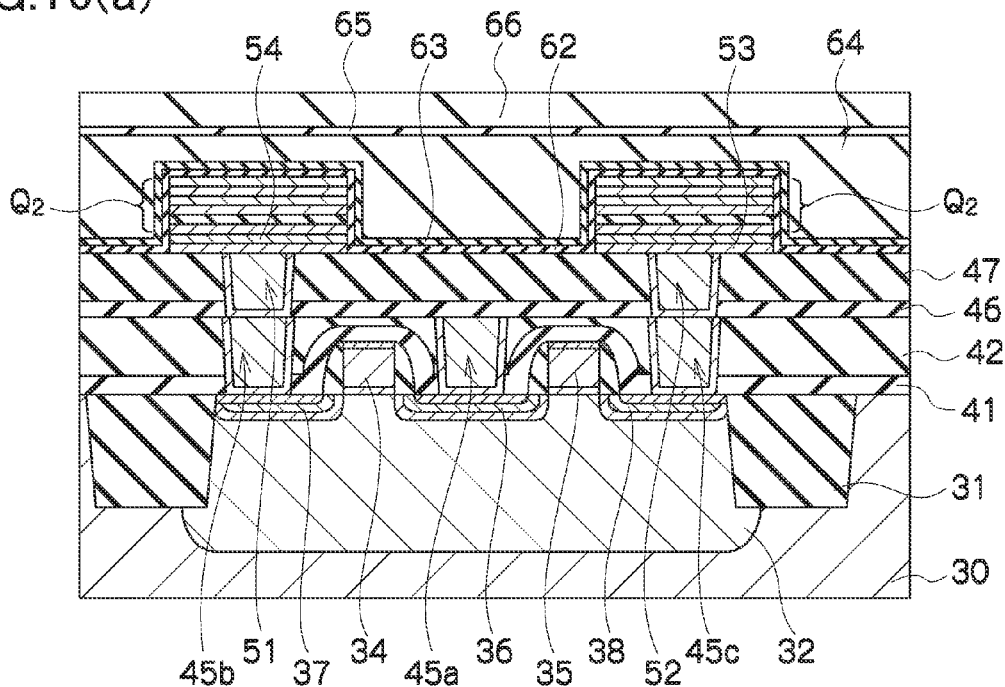

Then, as illustrated in FIG. 16(a), a fourth interlayer insulating film 66 is formed on the whole surface of the barrier film 65. As the fourth interlayer insulating film 66, a silicon oxide film having a film thickness of 800 nm to 1000 nm is formed by the plasma CVD method using TEOS gas, for example. In this case, as the fourth interlayer insulating film 66, a SiON film, a silicon nitride film, or the like may be formed. After this, a surface of the fourth interlayer insulating film 66 is planarized by the CMP method, for example.

Figure 16B:
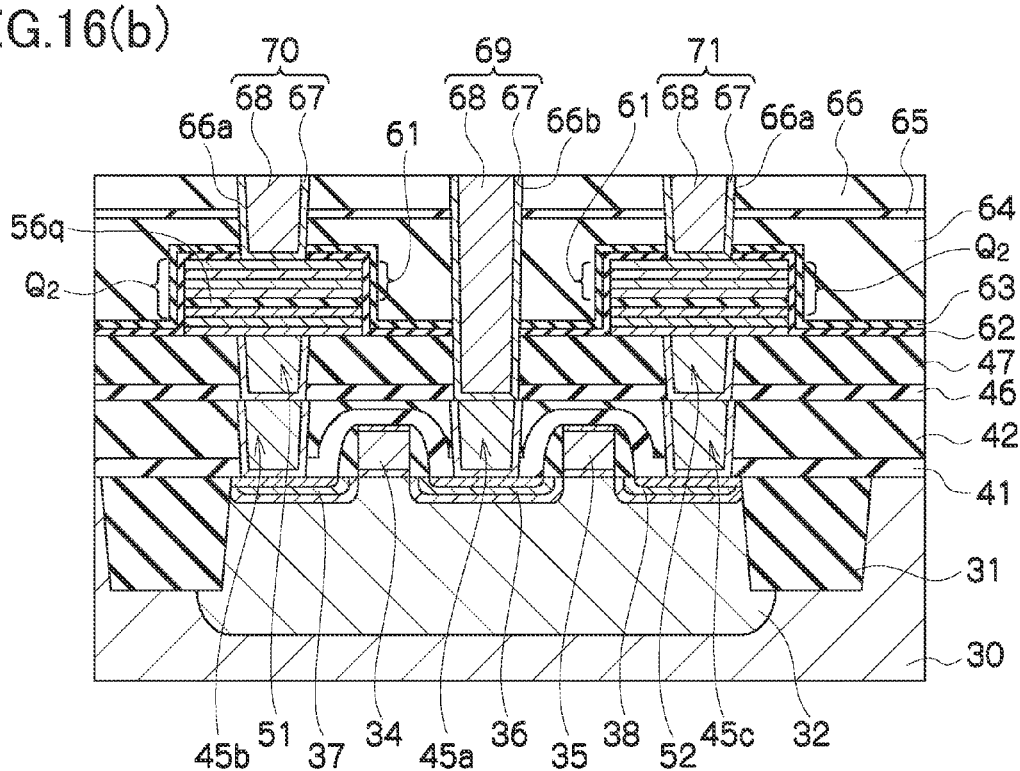

Then, as illustrated in FIG. 16(b), sixth to eighth conductive plugs 69 to 71 are formed on the ferroelectric capacitor $Q_2$. The sixth to eighth conductive plugs 69 to 71 are formed by following steps.

First, a resist pattern (not illustrated) in which an opening portion is provided over the ferroelectric capacitors $Q_2$ respectively is formed on the fourth interlayer insulating film 66. Then, the respective films from the fourth interlayer insulating film 66 to the third interlayer insulating layer 64 are etched, using the resist pattern as a mask. Thus, a via hole 66a is formed on capacitor upper electrodes 60 of the ferroelectric capacitors $Q_2$ respectively. Accordingly, the second protection insulating film 63 is exposed from the first via hole 66a.

After the resist pattern is removed, the silicon substrate 30 is put in the oxygen atmosphere and is annealed at 450° C. Therefore, the oxygen defect caused due to the formation of the via hole 66a in the capacitor dielectric film 56q is recovered.

After this, respective films from the fourth interlayer insulating film 66 to the first interlayer insulating film 42 are etched by the same method as the formation of the via hole 66a. Thus, a contact hole 66b is formed over the first conductive plug 45a formed in the center area of the p-well 32. Accordingly, the oxidation preventing film 46 is exposed from the contact hole 66b.

Then, the oxidation preventing film 46 is wet-etched through the via holes 66a, and thus an upper surface of the capacitor upper electrode 60 is exposed. Also, the first and second protection insulating films 62, 63 are etched partially through the contact hole 66b, and thus an upper surface of the first conductive plug 45a is exposed.

Then, a TiN film is formed as an adhesive layer 67 on surfaces of the via holes 66a and the contact hole 66b as a single layer. The adhesive layer 67 may be constructed by the double-layered structure obtained when a Ti film is formed by the sputter and a TiN film is formed thereon by the MOCVD method.

Since the carbon is removed from the surface of the TiN film after the TiN film is formed, the TiN film is processed in a mixed gas plasma consisting of nitrogen and hydrogen. In this process, in the present embodiment, the uppermost layer of the capacitor upper electrode 60 is formed of the metal nitride compound film 59 and the metal film 58 that have a hydrogen barrier function respectively. Therefore, the capacitor upper electrode 60 is hard to be reduced by the hydrogen.

Then, a W film 68 is grown on the adhesive layer 67 by the CVD method, and thus the W film 68 is filled in the via holes 66a and the contact hole 66b. Then, the W film 68 and the adhesive layer 67 formed on the fourth interlayer insulating film 66 are removed by the CMP method.

Accordingly, the W film left in the contact hole 66b constitutes the sixth conductive plug 69, and the W film left in the via holes 66a constitutes the seventh and eighth conductive plugs 70, 71 respectively.

Then, a Ti film whose thickness is 60 nm, a TiN film whose thickness is 30 nm, an AlCu alloy film whose thickness is 360 nm, a Ti film whose thickness is 5 nm, and a TiN film whose thickness is 70 nm are formed sequentially on the fourth interlayer insulating film 66 by the sputter method, for example. As a result, a stacked film consisting of the Ti film, the TiN film, the AlCu alloy film, the Ti film, and the TiN film is formed.

Figure 17:
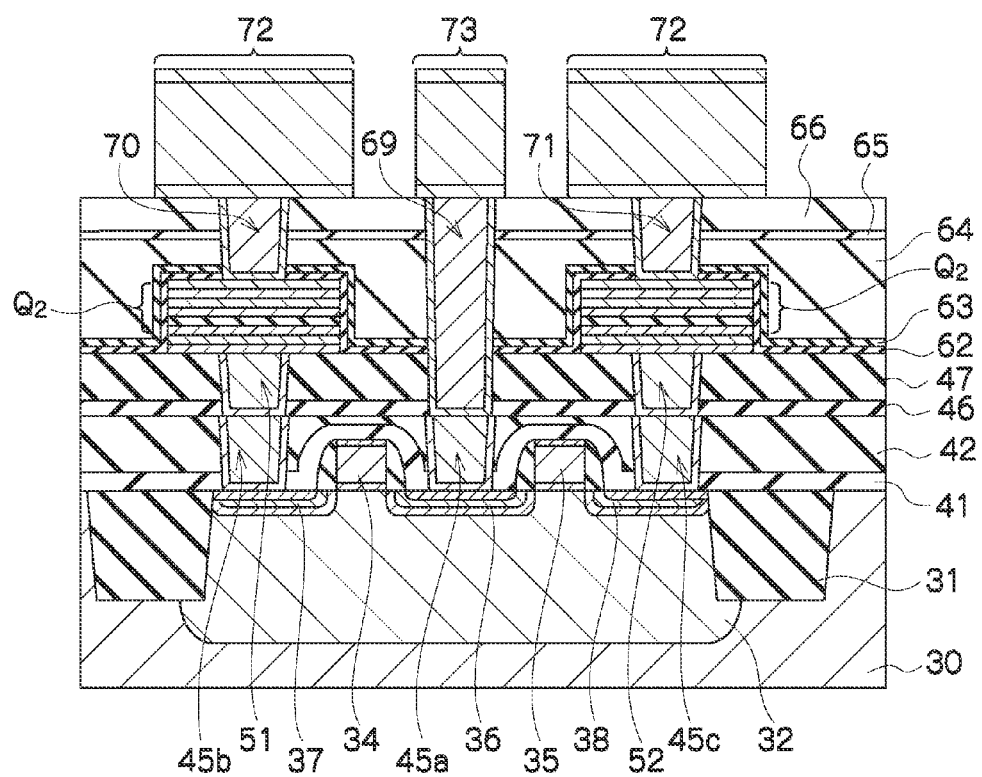

Then, as illustrated in FIG. 17, the stacked film is patterned by the photolithography technology. Thus, a wiring, i.e., first metal wiring layer made of the stacked film is formed. That is, a wiring 72 connected to the seventh conductive plug 70, i.e., via plug, and a conductive pad 73 connected to the sixth conductive plug 69, and the like are formed. In this case, two via plugs 70, 71 may not be connected mutually via the wiring 73.

Then, formation of the interlayer insulating film, formation of the contact plug, formation of wirings in the second to fifth layers from the bottom, and the like are performed. Then, the cover film consisting of the TEOS oxide film and the SiN film, for example, is formed, and thus the ferroelectric memory having the ferroelectric capacitor is completed. Detailed explanation will be omitted herein.

In the capacitor upper electrode 61 of the ferroelectric capacitor $Q_2$ constructed as above, the boundary to the ferroelectric film 56 is made flat by using the first conductive oxide film 57a whose degree of oxidation is low, and also the capacitor characteristic are improved. Also, when the second conductive oxide film 57b whose oxygen composition is equal or close to a stoichiometric composition is employed, a catalytic action of the constitutive metal is hard to occur, and also a density of the crystals becomes uniform. Therefore, the voids (crumbliness) in the second conductive oxide film 57b become vary small, and reducing gas is hard to pass through this film. As a result, deterioration of the ferroelectric film 56 due to a reducing gas is prevented.

Also, the metal film 58 made of the noble metal such as Ir, or the like is formed on the second conductive oxide film 57b. Therefore, conductivity of the capacitor upper electrode 61 is improved, and also a resistance is reduced. Also, the metal film 58 has a function of enhancing the adhesion between the overlying metal nitride compound film 59 and the first and second conductive oxide films 57a, 57b.

The metal nitride compound film 59 prevents the hydrogen and the moisture, which passes through the interlayer insulating film 64 or the contact hole 66a on the capacitor upper electrode 6, from entering into the metal film 58. Accordingly, the reduction of the first and second conductive oxide films 57a, 57b is prevented, and also the generation of voids is prevented.

According to the above capacitor upper electrode 61, the process-deterioration resistant capability of the capacitor is extremely improved. As a result, a quantity of inverted charges in the ferroelectric capacitor $Q_1$ may be increased, a coercive electric field may be reduced, and also the fatigue resistance and the imprint resistance may be improved.

Meanwhile, out of the four-layer structure in the capacitor upper electrode 61, the first conductive oxide film 57a formed to planarize the boundary to the ferroelectric film 56, and the metal nitride compound film 59 formed to prevent the entering of the moisture or the hydrogen into the first conductive oxide film 57a are essential for the characteristic improvement.

Figure 18A:
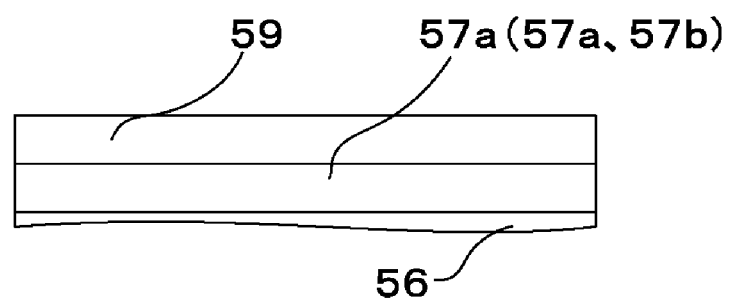
FIGS. 18(*a*) and 18(*b*) are sectional views illustrating a structure of a second example and a third example of an upper electrode of a ferroelectric capacitor in the semiconductor device according to the second embodiment of the present invention respectively.
Figure 18B:
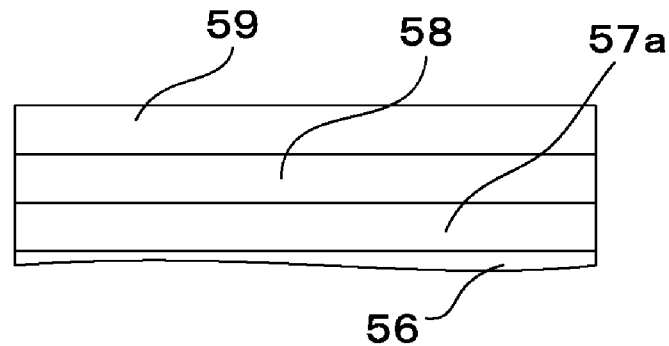

Therefore, in addition to the four-layered structure, as illustrated in FIG. 18(a), the two-layered structure constructed by forming the first conductive oxide film 57a and the metal nitride compound film 59 on the ferroelectric film 56 may be employed as the capacitor upper electrode 61. Also, the metal nitride compound film 59 may be formed on one conductive oxide film that consists of the first and second conductive oxide films 57a, 57b. Also, as illustrated in FIG. 18(b), the three-layered structure constructed by forming the metal film 58 made of the noble metal between the first conductive oxide film 57a and the metal nitride compound film 59 to reduce a resistance may be employed.

Third Embodiment

FIGS. 19(a), 19(b), 20(a), and 20(b) are sectional views illustrating a ferroelectric memory, i.e., semiconductor device according to a third embodiment of the present invention and a method of manufacturing the same. In FIG. 19(a), 19(b), 20(a), and 20(b), the same reference symbols as those in FIGS. 8(a), 8(b), 8(b), 9(a), 9(b), 9(b), 10(a), 10(b), 10(c), 11(a), 11(b), 12(a), 12(b), 13(a), 13(b), 14(a), 14(b), 15(a), 15(b), 16(a), 16(b), and 17 denote the same elements.

Figure 9A:
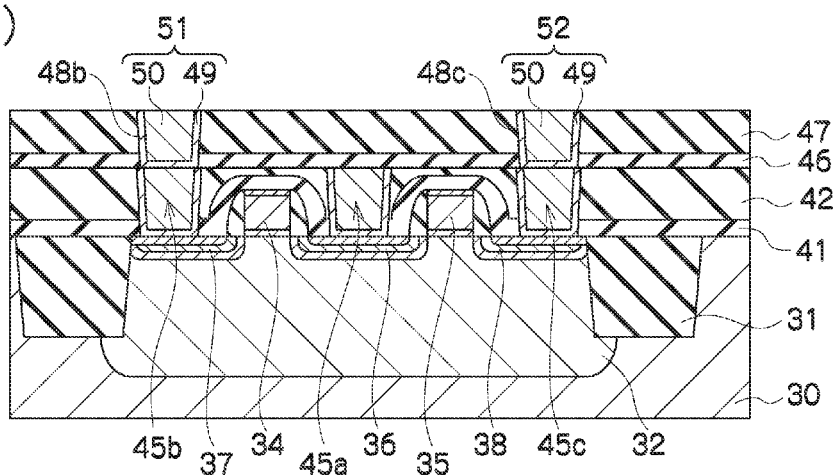
Figure 9B:
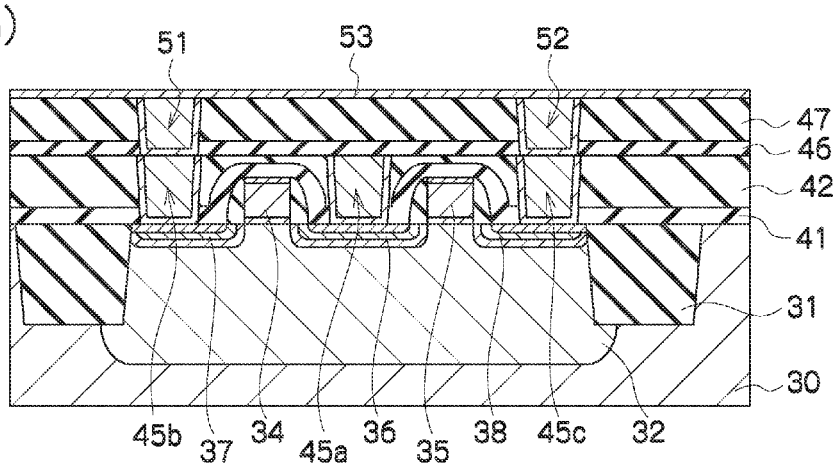
Figure 9C:
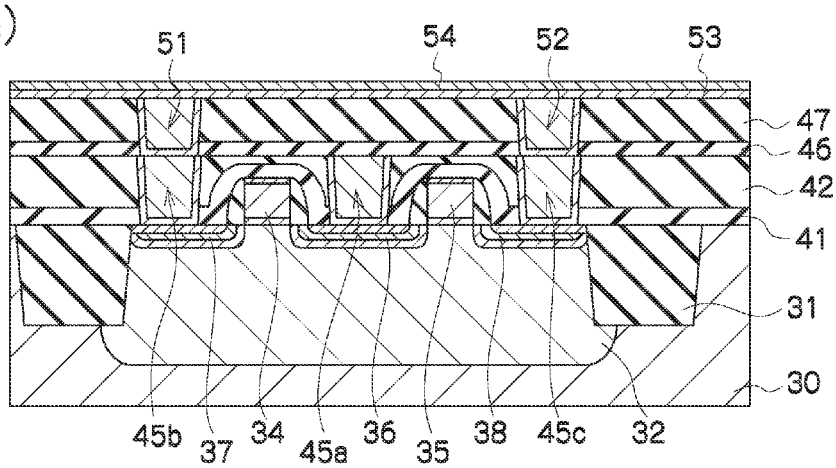

First, as illustrated in FIG. 9(a), the similar processes to those in the second embodiment are applied until the fourth and fifth conductive plugs 51, 52 are formed on the second interlayer insulating film 47. According to the CMP to form the fourth and fifth conductive plugs 51, 52, normally a height of the upper surfaces of the fourth and fifth conductive plugs 51, 52 becomes lower than an upper surface of the second interlayer insulating film 47, and a recess is ready to be formed in the second interlayer insulating film 47 around the fourth and fifth conductive plugs 51, 52. A depth of the recess 47r is 20 nm to 50 nm, typically about 50 nm.

The recess has an influence on respective face orientations of a plurality of films from the underlying conductive film 53 to the ferroelectric film 56, which are formed sequentially on the second interlayer insulating film 47. But such influence may be reduced by steps described as follows.

Figure 19A:
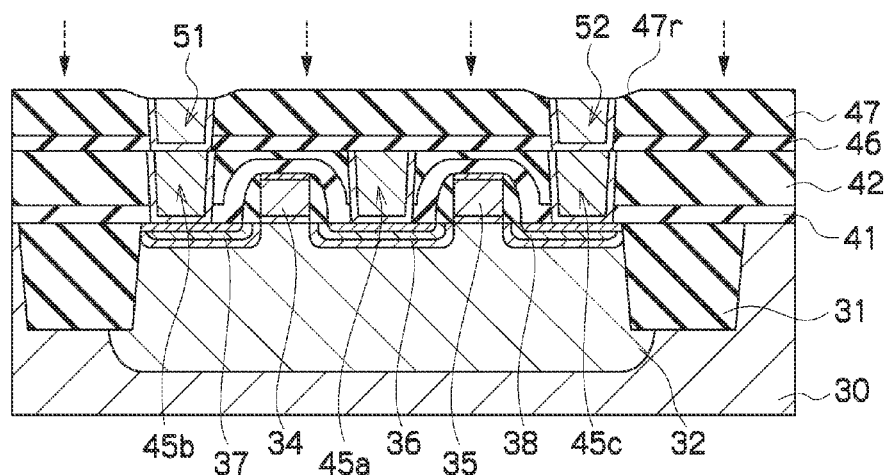
FIGS. 19(*a*), 19(*b*), 20(*a*), and 20(*b*) are sectional views illustrating steps of forming a semiconductor device according to a third embodiment of the present invention.

Then, as illustrated in FIG. 19(a), the surface of the second interlayer insulating film 47 is processed by the ammonia ($NH_3$) plasma. Thus, the NH group is bonded to the oxygen atoms on the surface of the second interlayer insulating film 47.

Figure 19B:
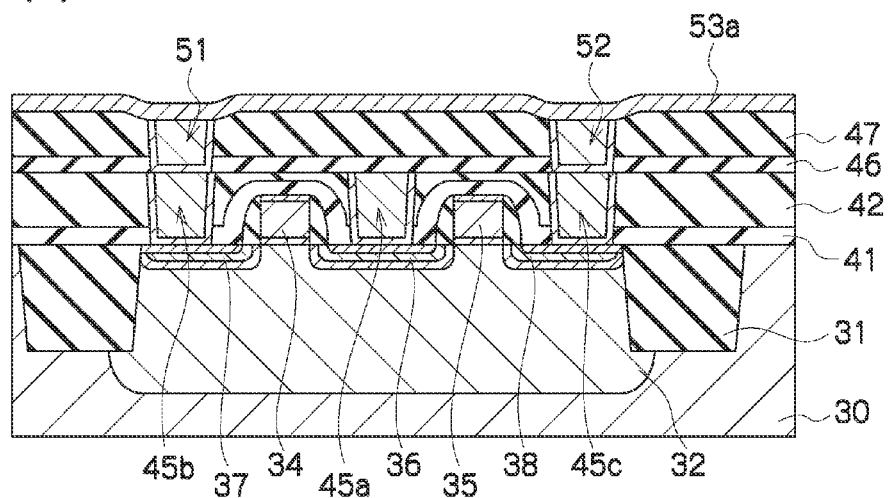

Upon stacking the Ti atoms constituting the underlying conductive film 53 on the second interlayer insulating film 47, the Ti atom is hard to be captured by the oxygen atom of the second interlayer insulating film 47 on the surface of the second interlayer insulating film 47 to which the NH group is bonded. Thus, the Ti atom may move freely on the surface of the second interlayer insulating film 47. As a result, as illustrated in FIG. 19(b), a Ti film 53a that is self-organized in the (002) orientation is formed on the second interlayer insulating film 47.

In this ammonia plasma process, the parallel-plate plasma processing equipment in which the opposing electrodes are provided in positions that is separated from the semiconductor substrate 30 by about 9 mm (350 mils), for example, is employed. Also, ammonia gas is supplied at a flow rate of 350 sccm to the processing vessel that is held at a substrate temperature of 400° C. at a pressure of 266 Pa (2 Torr), a high-frequency power of 100 W is applied to the silicon substrate 30 side at 13.56 MHz, and a high-frequency power of 55 W is applied to the opposing electrodes at 350 kHz.

Also, as the conditions of forming the Ti film, for example, an Ar atmosphere of 0.15 Pa and a substrate temperature of 20° C. are set in the sputter equipment in which a distance between the silicon substrate 30 and the Ti target is set to 60 mm, and a DC sputter power of 2.6 kW is supplied between the target and the substrate for 35 sec. Accordingly, the Ti film 53a having the strong (002) orientation is formed on the second interlayer insulating film 47. The Ti film 53a is formed to have a thickness of 100 nm, for example.

Figure 20A:
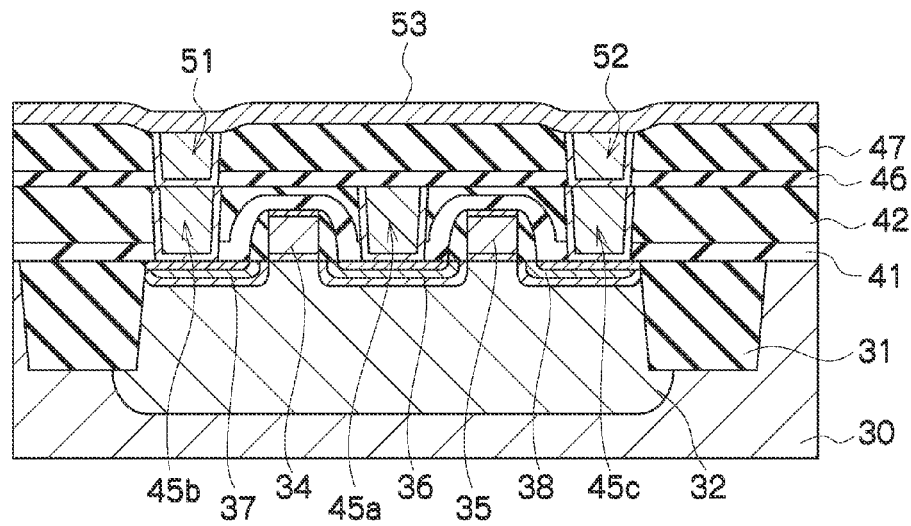

Then, the silicon substrate 30 is put in the nitrogen atmosphere, then the heat treatment is applied at a substrate temperature of 650° C. for 60 sec by the RTA, and thus the Ti film 53a is nitrided. Accordingly, as illustrated in FIG. 20(a), the underlying conductive film 53 made of TiN having the (111) orientation is formed on the second interlayer insulating film 47. It is preferable that a thickness of the underlying conductive film 53 should be set to 100 to 300 nm. In the present embodiment, a thickness is set to about 100 nm.

In this case, the underlying conductive film 53 is not limited to the titanium nitride film. Any one of a tungsten film, a silicon film, and a copper film may be formed as the underlying conductive film 53.

By the way, a concave portion is formed on an upper surface of the underlying conductive film 53 made of TiN depending on a depth of a recess 47r and the forming conditions of the Ti film 53a. In FIG. 20(a), such concave portion is depicted. Such concave portion may deteriorate the crystallinity of the ferroelectric film 56 formed over the underlying conductive film 53.

Figure 20B:
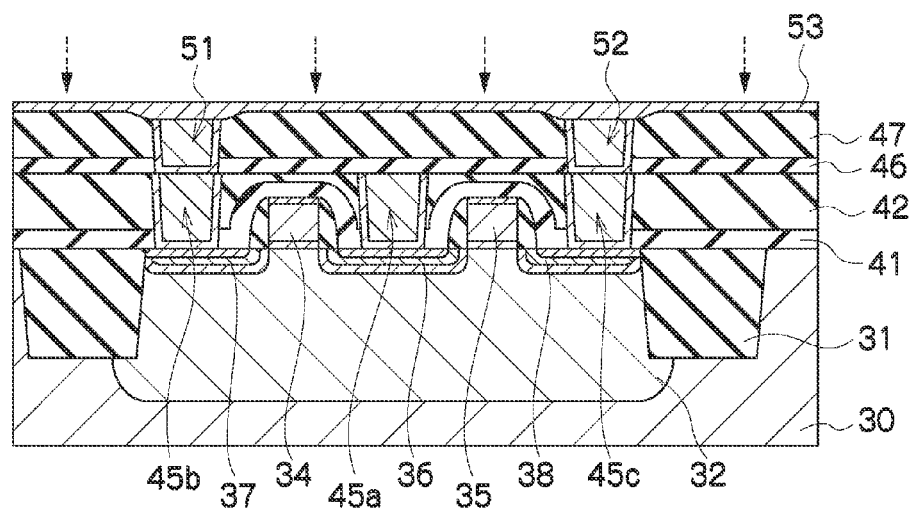

Therefore, in the present embodiment, as illustrated in FIG. 20(b), an upper surface of the underlying conductive film 53 is polished by the CMP method such that the upper surface is planarized and the concave portion is removed. The slurry employed by this CMP method is not particularly limited. In the present embodiment, SSW 2000 (product name) manufactured by Cabot Miroelectronics Corporation is employed.

A thickness of the underlying conductive film 53 is processed by the CMP method and is varied due to a polishing error in a plane of the silicon substrate 30 or every silicon substrate 30. In the present embodiment, with regard to such variation, a target value of a thickness of the underlying conductive film 53 after the CMP is set to 50 nm to 100 nm, more preferably 50 nm, by controlling a polishing time.

An upper surface of the underlying conductive film 53 that is in an as-polished state yet is easily distorted by the polishing. Then, when the lower electrode film 55 of the capacitor is formed over the underlying conductive film 53 in which crystal distortion is caused, the lower electrode film 55 picks up such crystal distortion and its crystallinity is deteriorated. In turn, the ferroelectric characteristic of the overlying ferroelectric film 56 is deteriorated.

Therefore, as illustrated in FIG. 20(b), the polished surface of the underlying conductive film 53 is exposed to the NH$_3$ plasma such that the crystal distortion of the underlying conductive film 53 is not transferred to the film that is formed over the underlying conductive film 53.

Accordingly, the elements constituting the oxygen diffusion barrier film 54 formed subsequently are ready to move on the upper surface of the underlying conductive film 53, and the crystal orientation of the oxygen diffusion barrier film 54 is improved. As a result, the ferroelectric characteristics of the lower electrode film 55 and the ferroelectric film 56 formed on the oxygen diffusion barrier film 54 are improved.

As described above, the processes applied after the polished surface of the underlying conductive film 53 is exposed to the NH$_3$ plasma are similar to those in the second embodiment.

As a result, according to the present embodiment, not only the crystal orientation of the lower electrode film 55 and the ferroelectric film 56 is improved but also the same advantages as those in the second embodiment may be achieved.

Fourth Embodiment

FIGS. 21(a), 21(b), 22(a), and 22(b) are sectional views illustrating steps of forming a semiconductor device according to a fourth embodiment of the present invention. In FIGS. 21(a), 21(b), 22(a), and 22(b), the same reference symbols as those in FIGS. 8(a), 8(b), 8(b), 9(a), 9(b), 9(b), 10(a), 10(b), 10(c), 11(a), 11(b), 12(a), 12(b), 13(a), 13(b), 14(a), 14(b), 15(a), 15(b), 16(a), 16(b), and 17 denote the same elements.

First, as illustrated in FIG. 20(a), the steps required until the underlying conductive film 53 is formed on the second interlayer insulating film 47 are similar to those in the third embodiment.

Figure 21A:
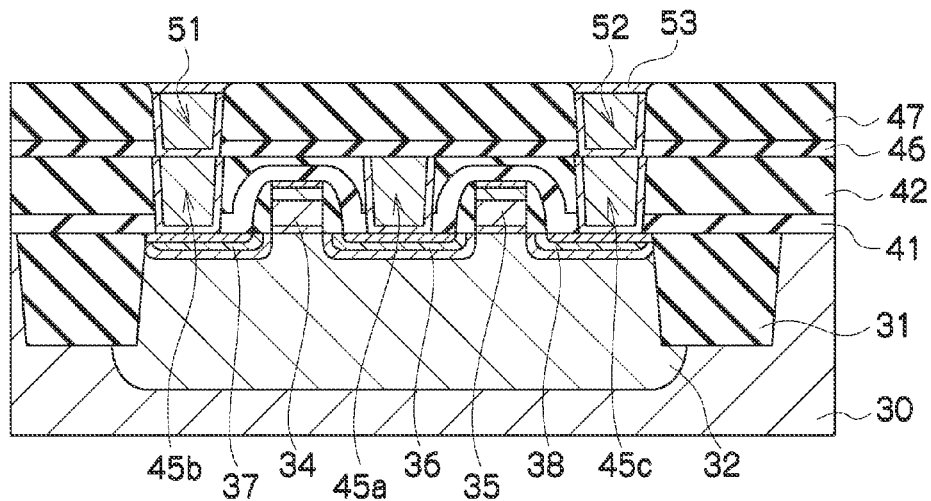
FIGS. 21(*a*), 21(*b*), 22(*a*), and 22(*b*) are sectional views illustrating steps of forming a semiconductor device according to a fourth embodiment of the present invention.

Then, as illustrated in FIG. 21(a), the underlying conductive film 53 is polished by the CMP method such that the underlying conductive film 53 is left only on the fourth and fifth conductive plugs 51, 52 and the peripheral recesses 47r.

Figure 21B:
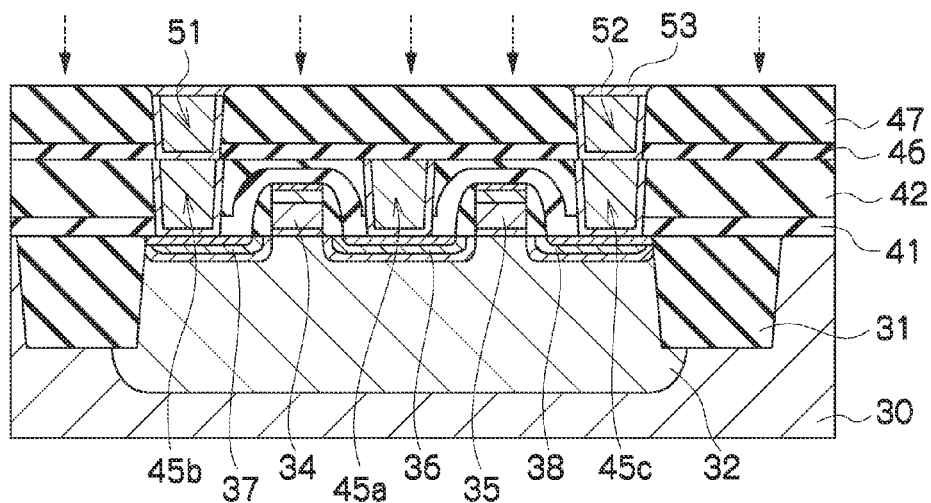

Then, as illustrated in FIG. 21(b), the ammonia plasma is applied to the underlying conductive film 53 and the second interlayer insulating film 47 on the fourth and fifth conductive plugs 51, 52.

Figure 22A:
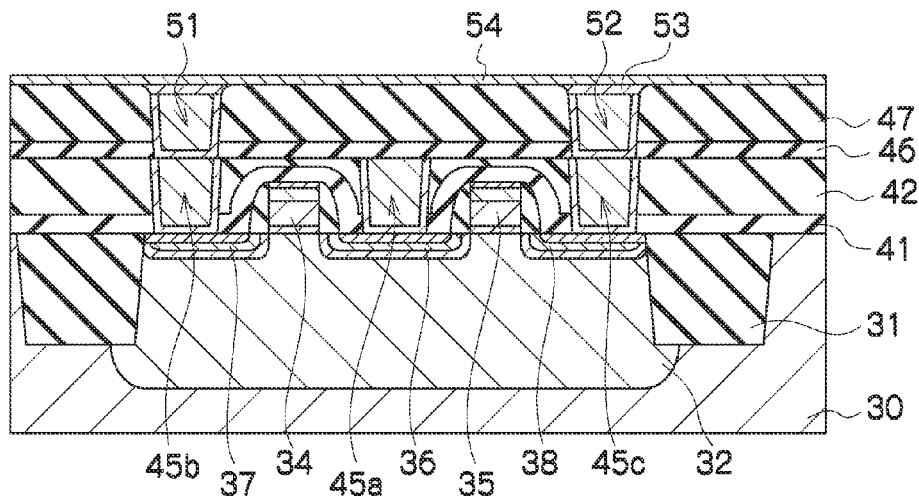

Accordingly, as illustrated in FIG. 22(a), the crystal orientation of the oxygen diffusion barrier film 54 formed on the underlying conductive film 53 and the second interlayer insulating film 47 is improved. Like the third embodiment, the crystal orientation of the lower electrode film 55 and the ferroelectric film 56 formed thereon is also improved.

Figure 22B:
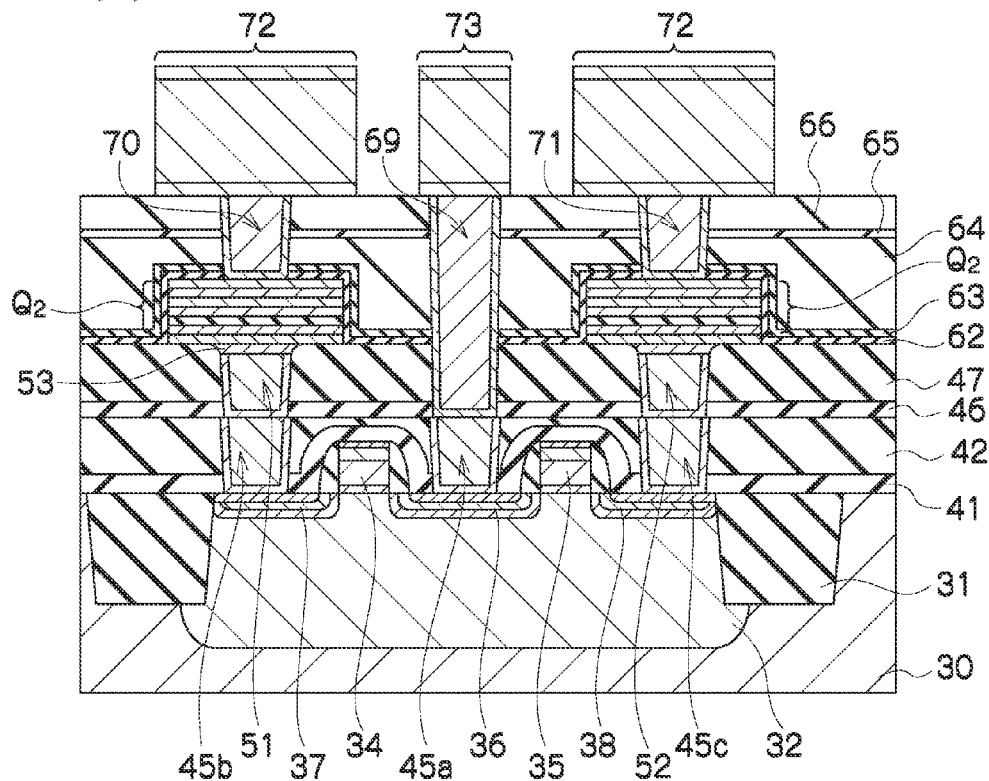

As described above, the processes applied after the polished surfaces of the underlying conductive film 53 and the second interlayer insulating film 47 are exposed to the NH$_3$ plasma follow up the same steps as those in the third embodiment. As a result, the semiconductor device having the structure illustrated in FIG. 22(b) is formed.

Fifth Embodiment

FIG. 23(a), 23(b), 24(a), and 24(b) are sectional views illustrating steps of forming a semiconductor device according to a fifth embodiment of the present invention. In FIGS. 23(a), 23(b), 24(a), and 24(b), the same reference symbols as those in FIGS. 8(a), 8(b), 8(b), 9(a), 9(b), 9(b), 10(a), 10(b), 10(c), 11(a), 11(b), 12(a), 12(b), 13(a), 13(b), 14(a), 14(b), 15(a), 15(b), 16(a), 16(b), and 17 denote the same elements.

First, as illustrated in FIG. 8(a), the steps required until the first interlayer insulating film 42 is formed after the STI 31 and the p well 32 are formed on the silicon substrate 30 are similar to those in the first embodiment.

Figure 23A:
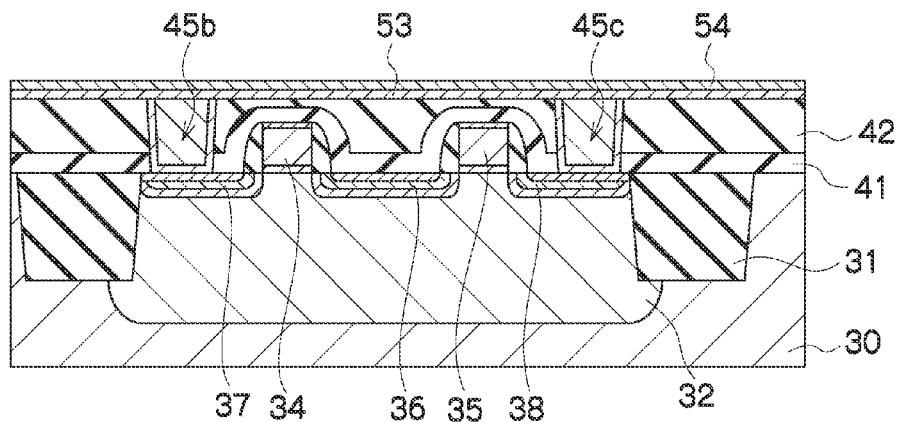
FIGS. 23(*a*), 23(*b*), 24(*a*), and 24(*b*) are sectional views illustrating steps of forming a semiconductor device according to a fifth embodiment of the present invention.

Then, as illustrated in FIG. 23(a), the cover insulating film 41 and the first interlayer insulating film 42 are patterned by the photolithography method. Thus, the second and third contact holes 42b, 42c from which the second and third source/drain regions 37, 38 located near both sides of the p well 32 are exposed respectively are formed. Then, the second and third conductive plugs 45b, 45c are formed in the second and third contact holes 42b, 42c respectively. The method of forming the second and third conductive plugs 45b, 45c is similar to that in the first embodiment.

Then, the underlying conductive film 53 is formed directly on the first interlayer insulating film 42, and then the oxygen diffusion barrier film 54 is formed thereon. The same method as that applied to the third embodiment and the fourth embodiment may be employed to form the underlying conductive film 53.

Figure 23B:
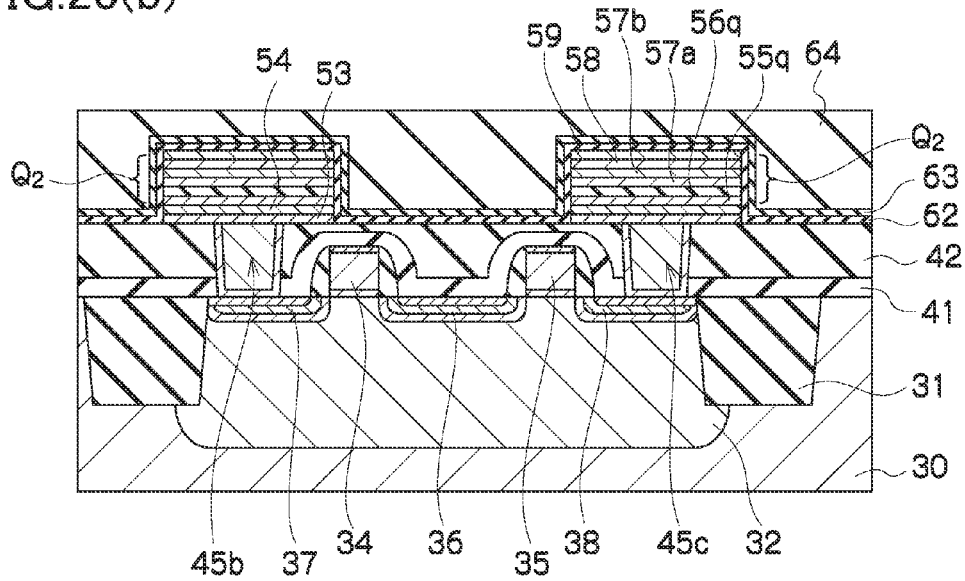

Then, as illustrated in FIG. 23(b), the structure from the formation of the underlying conductive film 53 to the third interlayer insulating layer 64 are formed by the same processes as those applied in the second embodiment.

Figure 24A:
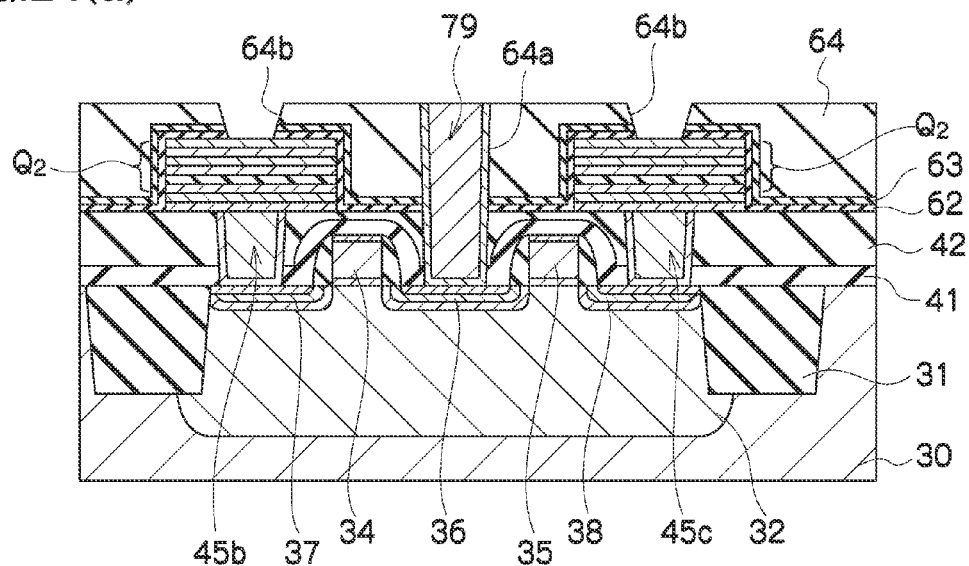

Then, as illustrated in FIG. 24(a), respective films from the third interlayer insulating layer 64 to the cover insulating film 41 on the first source/drain region 36 located at the center of the p-well 32 are etched partially by the photolithography method. Thus, a contact hole 64a is formed.

Then, a conductive plug 79 is buried in the contact hole 64a. The conductive plug 79 is formed by the same method as that applied to form the sixth conductive plug 69 in the second embodiment.

Then, a via hole 64b is formed on the ferroelectric capacitors $Q_2$ respectively by the similar method to that in the second embodiment.

Figure 24B:
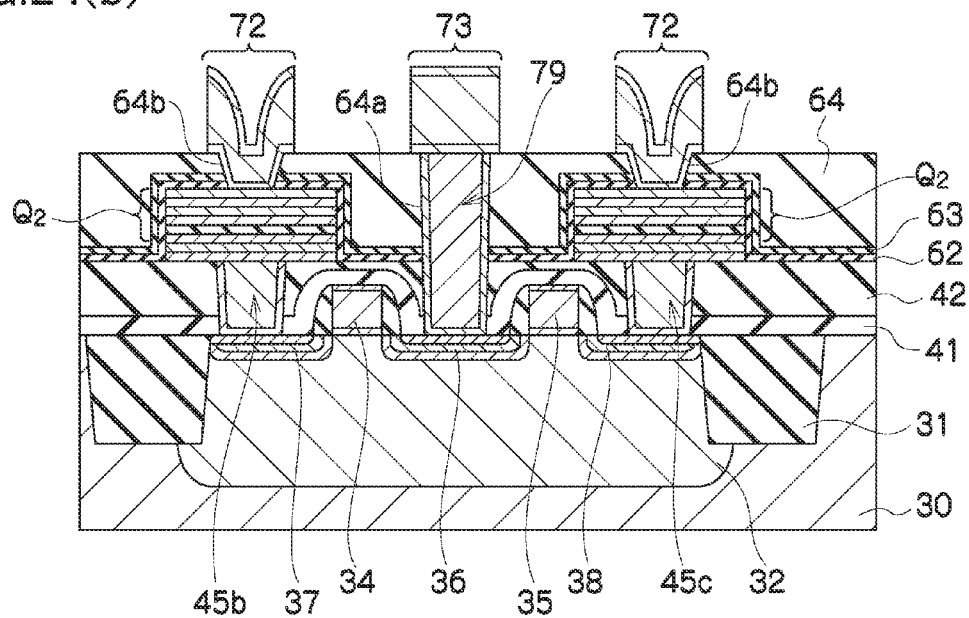

Then, as illustrated in FIG. 24(b), the wirings 72 connected to the capacitor upper electrode 61 through the via hole 64b respectively are formed on the third interlayer insulating layer 64.

According to the above embodiment, only the step of forming the conductive plug 79 is applied once to the third interlayer insulating layer 64. Thus, the number of steps is reduced in contrast to the second embodiment.

In the above first to fifth embodiments, the PZT is employed as the ferroelectric film. In this case, the film whose crystal structure has a Bi-layer structure or a perovskite-type structure by the heat treatment, for example, may be formed. As such film, a film that is expressed by a general formula $XYO_3$ (X, Y is an element, and O is oxygen) such as PZT, SBT, BLT, in which La, Ca, Sr, Si, and/or the like is micro-doped, Bi-based layer compound, or the like may be listed in addition to the PZT film. Also, the ferroelectric film may be formed of any one of the sol-gel method, the organic metal decomposing method, the CSD (Chemical Solution Deposition) method, the chemical vapor deposition method, the epitaxial growth method, the sputter method, or the MOCVD method.

The embodiments explained above are mentioned merely as typical examples. It is obvious for those skilled in the art that variations and modifications may be applied by combining the constituent elements of respective embodiments. It is obvious for those skilled in the art that various variations may be applied to the above embodiments without departing from the principle of the present invention and a scope of the invention set forth in claims.

What is claimed is:

1. A semiconductor device, comprising:
a ferroelectric capacitor, formed over a semiconductor substrate, including a lower electrode, a ferroelectric film formed on the lower electrode, and an upper electrode formed on the ferroelectric film,
wherein the upper electrode includes
a first conductive film formed of first conductive noble metal oxide and formed over the ferroelectric film,
a second conductive film formed of metal nitride compound and formed over the first conductive film, and
a fourth conductive film formed of a second conductive metal oxide and formed between the first conductive film and the second conductive film, and an oxidation composition of the fourth conductive film is larger than an oxidation composition of the first conductive film.

2. The semiconductor device according to claim 1, wherein the metal nitride compound includes a metallic element that is different from a metallic element in the first conductive noble metal oxide.

3. The semiconductor device according to claim 1, wherein the upper electrode has a third conductive film formed of noble metal and formed between the fourth conductive film and the second conductive film.

4. The semiconductor device according to claim 3, wherein the first conductive noble metal oxide includes a metallic element same as the noble metal included in the third conductive film.

5. The semiconductor device according to claim 3, wherein the first conductive noble metal oxide includes a metallic element different from the noble metal included in the third conductive film.

6. The semiconductor device according to 1, wherein the metal nitride compound is a nitride compound including two or more metallic elements.

7. The semiconductor device according to claim 1, wherein the fourth conductive film and the first conductive film have same noble metallic element.

8. The semiconductor device according to claim 1, wherein the fourth conductive film and the first conductive film have different noble metallic element.

9. The semiconductor device according to claim 1, wherein
the first conductive film is formed of a first oxide film whose composition is expressed by a chemical formula $AO_{x1}$ (A: metallic element, O: oxygen) using an initial composition parameter x1, and whose composition is expressed by a chemical formula $AO_{x2}$ using an actual composition parameter x2, and
the fourth conductive film is formed of a second oxide film which is formed on the first conductive film, whose composition is expressed by a chemical formula $BO_{y1}$ (B: metallic element, O: oxygen) using an initial composition parameter y1, and whose composition is expressed by a chemical formula $BO_{y2}$ using an actual composition parameter y2, which includes at least one of stone-wall crystal and column crystal, and in which a degree of oxidation is set higher than the first oxide film, whereby a relation $Y2/y1>x2/x1$ is satisfied between the composition parameters x1, x2, y1, and y2.

10. The semiconductor device according to claim 1, wherein a metallic element included in at least one of the first conductive film and the fourth conductive film is iridium or ruthenium.

11. The semiconductor device according to claim 1, wherein the second conductive film is formed of at least one of a TiAlN film, a TiAlON film, a TaAlN film, and a TaAlON film.

12. The semiconductor device according to claim 3, wherein the third conductive film is formed of at least one of an iridium film, a platinum film, a ruthenium film, a rhodium film, and a palladium film.

* * * * *